United States Patent
Ohmi et al.

(10) Patent No.: US 8,227,912 B2
(45) Date of Patent: Jul. 24, 2012

(54) SEMICONDUCTOR DEVICE WITH CU METAL-BASE AND MANUFACTURING METHOD THEREOF

(75) Inventors: Tadahiro Ohmi, Miyagi (JP); Akihiro Morimoto, Miyagi (JP)

(73) Assignee: Foundation for Advancement of International Science, Tsukuba-Shi (JP)

(*) Notice: Subject to any disclaimer, the term of this patent is extended or adjusted under 35 U.S.C. 154(b) by 127 days.

(21) Appl. No.: 11/664,279

(22) PCT Filed: Oct. 10, 2004

(86) PCT No.: PCT/JP2004/014894
§ 371 (c)(1),
(2), (4) Date: Apr. 16, 2007

(87) PCT Pub. No.: WO2006/038305
PCT Pub. Date: Apr. 13, 2006

(65) Prior Publication Data
US 2007/0252243 A1    Nov. 1, 2007

(51) Int. Cl.
*H01L 23/36* (2006.01)
(52) U.S. Cl. . 257/720; 257/678; 257/684; 257/E23.101; 438/26; 438/122; 438/455
(58) Field of Classification Search ............... 257/628, 257/751, E21.461, 720, E23.101; 438/122
See application file for complete search history.

(56) References Cited

U.S. PATENT DOCUMENTS

| | | | | |
|---|---|---|---|---|
| 4,857,986 A * | 8/1989 | Kinugawa | | 257/255 |
| 5,384,473 A * | 1/1995 | Yoshikawa et al. | | 257/255 |
| 5,536,361 A | 7/1996 | Kondo et al. | | |
| 6,309,965 B1 * | 10/2001 | Matschitsch et al. | | 438/653 |
| 6,677,648 B1 * | 1/2004 | Ohmi | | 257/374 |
| 2002/0187619 A1 * | 12/2002 | Kleinhenz et al. | | 438/471 |
| 2003/0042525 A1 | 3/2003 | Tanaka | | |
| 2003/0141567 A1 * | 7/2003 | Akram | | 257/503 |
| 2003/0178637 A1 * | 9/2003 | Chen et al. | | 257/189 |
| 2005/0006709 A1 * | 1/2005 | Asai et al. | | 257/370 |

FOREIGN PATENT DOCUMENTS

| | | |
|---|---|---|
| JP | 50-36079 | 4/1975 |
| JP | 03-008371 | 1/1991 |
| JP | 04-042971 | 2/1992 |
| JP | 4-283914 | 10/1992 |
| JP | 05-094928 | 4/1993 |
| JP | 05-217825 | 8/1993 |
| JP | 5-217994 | 8/1993 |

(Continued)

OTHER PUBLICATIONS

Lee, Yoon-Jik et al.; Structural and chemical stability of Ta-Si-N thin film between Si and Cu, Thin Solid Films vol. 320, year 1998, pp. 141-146.*

(Continued)

*Primary Examiner* — N Drew Richards
*Assistant Examiner* — John P Dulka
(74) *Attorney, Agent, or Firm* — Foley & Lardner LLP

(57) ABSTRACT

As a substrate for a semiconductor device, a metal substrate is used, and the metal substrate is composed of a metal base body made of a first metal and a connecting metal layer made of a second metal for covering the metal base body. The substrate has a structure wherein a diffusion preventing layer for preventing diffusion of the first metal is provided on the connecting metal layer.

3 Claims, 14 Drawing Sheets

FOREIGN PATENT DOCUMENTS

| | | | |
|---|---|---|---|
| JP | 5-218036 | | 8/1993 |
| JP | 06-252091 | | 9/1994 |
| JP | 06252091 A | * | 9/1994 |
| JP | 8-255769 | | 10/1996 |
| JP | 09-127352 | | 5/1997 |
| JP | 10-150176 | | 6/1998 |
| JP | 3191972 B2 | | 5/2001 |
| JP | 2003/069019 | | 3/2003 |

OTHER PUBLICATIONS

Vasiliev, A.G.; Phase Formation in a Ta-Ni-N Thin Film during Its Electron-Beam Evaporation Deposition on a Heated Si(100) Substrate, Russian Microelectronics, vol. 32, No. 5, year 2003, pp. 275-281.*

Wang, H; TaN-TiN Binary Alloys and SuperLattices as Diffusion Barriers for Copper Interconnects, Journal of Electronic Materials, vol. 32, No. 10, year 2003, pp. 994-999.*

* cited by examiner

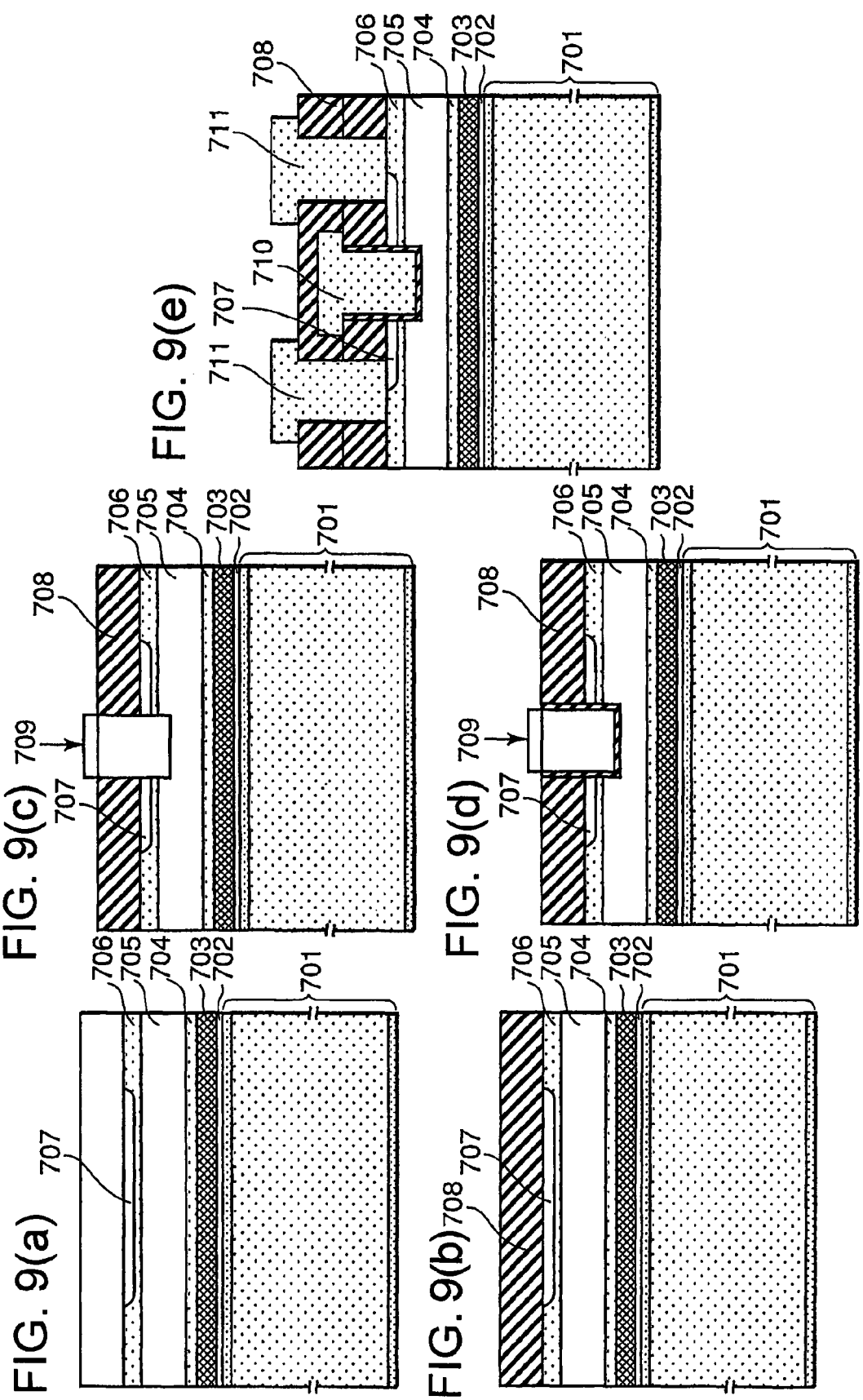

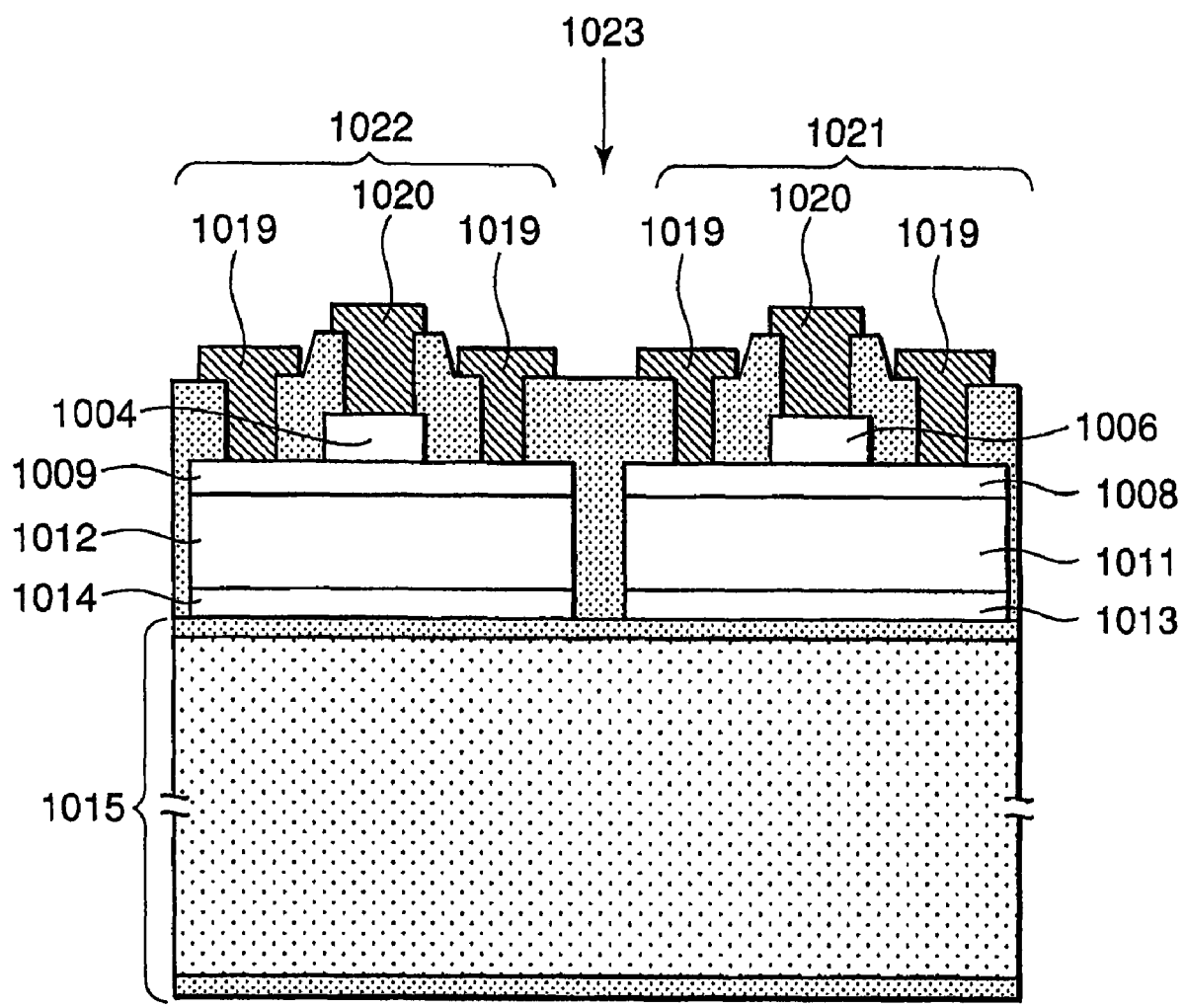

SEMICONDUCTOR DEVICE WITH CU METAL-BASE AND MANUFACTURING METHOD THEREOF

TECHNICAL FIELD

This invention relates to a semiconductor element that operates at high speed and high power, and a manufacturing method thereof.

BACKGROUND ART

High-speed transistors adapted to operate in a microwave band and high-power transistors for use in power conversion are applied to various fields such as household electrical appliances.

As a semiconductor element forming a high-speed transistor or a high-power transistor, there is a bipolar transistor, a thyristor, a GTO, an IGBT, a MOSFET, or the like. Such an element is required to turn on/off the high power at high speed in response to a pulse signal and, thus, for the purpose of satisfying both supply voltage resistance and speediness, use has been made of a semiconductor substrate that differs from an integrated circuit substrate formed in a flat shape.

As the semiconductor substrate that has been used for forming such an element, use has been made, as shown in FIG. 1, of a two-layer structured substrate having a structure in which a low-concentration n-type semiconductor silicon layer 1302 serving as a region for forming an element is stacked on a high-concentration n-type semiconductor silicon layer 1301 serving as a substrate base (or a structure in which the semiconductor conductivity type is reversed, i.e. a low-concentration p-type semiconductor silicon layer is stacked on a high-concentration p-type semiconductor silicon layer). Using an ion implantation technique, an impurity diffusion technique, a lithography technique, and so on, three or four semiconductor silicon layers having different impurity concentrations or different conductivity types are formed on the substrate, thereby forming a desired semiconductor element. In the semiconductor element thus formed, the current flows from the back side to the front side of the substrate (or in the opposite direction). Since the substrate of the element as manufactured has a large thickness of 200 μm to 1 mm, the electrical resistance of the substrate inserted in series in the element is large. Accordingly, using a backside polishing technique to polish the back surface of the high impurity concentration silicon substrate being the support substrate, the substrate thickness of the element is finally reduced to 20 μm to 200 μm for the purpose of reducing the series electrical resistance, and then a metal electrode is provided on the back side, thereby completing the semiconductor element.

The thickness of the semiconductor element finished with the backside polishing is about 200 μm. If the thickness is further reduced, there has arisen a problem that the mechanical strength is reduced to thereby cause breakage of the element, or the like.

In view of this, there has been required a substrate with a thin semiconductor layer, which is free from the problem of element breakage or the like.

As a technique of forming a structure having a thin silicon crystal layer on a metal substrate without using the foregoing backside polishing method, there is a technique, as described in Japanese Patent (JP-B) No. 3191972, which forms a porous silicon layer on a silicon single crystal substrate by an anodization method, then epitaxially grows a silicon single crystal at a temperature of about 950° C. and, after joining it to a metal substrate at a temperature of 800° C., separates the silicon substrate at the porous silicon layer, thereby producing the metal substrate having a thin silicon layer. However, the high temperature of 800° C. or more is used, there has arisen a problem of diffusion of metal atoms into the semiconductor layer and further arisen a problem that it is quite difficult to control an impurity concentration profile when forming the foregoing epitaxial layer in multilayers in advance and thus only the single semiconductor layer or the two-layer stacked semiconductor layers can be obtained, and therefore, the manufacture of a semiconductor element cannot be simplified.

Further, with respect to a plane orientation of a semiconductor silicon crystal for use in a conventional semiconductor element, the interface state density at the silicon/gate insulating film interface is small in a MOSFET or an IGBT and it has been only a {100} plane orientation where a good-quality oxide film with a high withstand voltage is obtained.

With respect to a conventional vertical-type semiconductor element, it has been difficult to form an element having both n-type and p-type polarities in a vertical direction and, in the case of forming a semiconductor circuit such as an inverter, it is formed by mounting individual semiconductor elements on a wiring board.

Referring back to the formation of the semiconductor element, a number of processes such as impurity ion implantation and diffusion are required for forming the semiconductor element and many of them require a thermal process near 1000° C., and therefore, it is difficult to control the impurity distribution in the element and thus the yield is reduced, thereby causing a problem that the element increases in price.

Since only the {100} plane can be used as a substrate plane orientation in terms of manufacturing technology, there has arisen a problem that the diffusion constants of electrons and holes are small and thus it is not possible to increase the speed of current conduction or interruption of the element.

Further, since the element is formed on the silicon substrate, the generated heat of the element is difficult to dissipate to the outside of the element and thus the temperature of the element rises and, therefore, there has arisen a problem that electrons or holes extremely increase, thereby causing thermal malfunction of the element or requiring a complicated temperature compensation circuit.

Further, since it has conventionally been difficult to form a plurality of vertical-type semiconductor elements on a single semiconductor substrate, there has arisen a problem that a semiconductor device formed using these semiconductor elements increases in size.

The foregoing problem that the semiconductor device increases in size due to incapability of integration has caused a problem that wiring connecting the adjacent semiconductor elements increases in distance and thus has caused a problem that the parasitic capacitance and inductance possessed by the wiring increase to disable speed-up of the semiconductor device.

DISCLOSURE OF THE INVENTION

It is an object of this invention to solve these problems, enables introduction of a thin semiconductor layer that cannot be achieved by the prior art, reduces the series resistance of a substrate, increases the operating speed of an element, makes it possible to easily obtain a substrate with an impurity concentration profile controlled in advance before manufacturing an element, and reduces the manufacturing cost of a semiconductor element.

Further, it is an object of this invention to form an element that enables current conduction or interruption at high speed by using, in the element, a (110) plane which can obtain a high electron diffusion constant and a high hole diffusion constant. Herein, the {110} plane orientation implies a plane crystallographically equivalent to a (110) plane and is a plane orientation collectively representing, for example, a (010) plane, a (001) plane, or the like.

Further, with respect to a semiconductor device formed using a plurality of semiconductor elements, an object is to shorten wiring connecting between the semiconductor elements by forming the elements on a single semiconductor substrate and thus to reduce parasitic capacitance and inductance possessed by the wiring, thereby enabling the semiconductor device to be driven at high speed.

For solving the conventional problems, this invention is a semiconductor substrate having a semiconductor layer formed on a substrate comprising a metal base and is characterized in that the metal substrate comprises a metal base made of a first metal, a diffusion preventing layer adapted to prevent diffusion of the metal forming the metal base into the semiconductor layer, and a connecting metal layer made of a second metal for electrical connection between the metal substrate and the semiconductor layer, that the semiconductor layer is a silicon layer having one of a {110} plane orientation and plane orientations equivalent thereto, and further that the semiconductor layer comprises a plurality of semiconductor layers having different conductivity types.

Further, a semiconductor element of this invention is characterized in that bipolar transistors, vertical-type MOSFETs, and IGBTs are formed alone or in combination thereof in a silicon crystal having a {110} plane orientation or a plane orientation equivalent thereto. Further, a vertical-type semiconductor element of this invention is characterized in that a plurality of vertical-type semiconductor elements having different polarities are separated by an element separating region and integrated on a single substrate.

Further, a semiconductor element of this invention is characterized by being formed on a metal substrate and in that a semiconductor layer located right over the metal substrate has a thickness of 20 μm or less. Further, a forming method of a semiconductor substrate and a semiconductor element of this invention is a manufacturing method of a semiconductor substrate having a plurality of semiconductor layers with difference conductivity types on a metal substrate and is characterized by comprising a step of forming porous silicon on a silicon substrate, a step of epitaxially growing semiconductor layers having a plurality of conductivity types on the porous silicon, a step of bonding together the epitaxial silicon layers and a metal substrate, and a step of cutting off, from a substrate in which the metal substrate and a semiconductor substrate having the epitaxial silicon layers are bonded together, the semiconductor substrate at an interface between the epitaxial silicon layers and the porous silicon layer. Further, a manufacturing method of a semiconductor element and a semiconductor substrate of this invention is characterized by comprising, in addition to the foregoing steps, a step of forming a plurality of vertical-type semiconductor elements having different polarities on the same substrate and a step of forming an element separating region for electrically separating the semiconductor elements.

Further, a forming method of a semiconductor substrate and a semiconductor element of this invention is characterized by comprising a step of forming the epitaxial silicon layers at a low temperature of 600° C. or less.

According to this invention, by stacking in advance a semiconductor silicon layer, made of a crystal with a {110} plane orientation and having a controlled impurity concentration profile, on a low-resistance metal substrate at a low temperature of about 600° C. or less, it is configured such that the semiconductor layer is formed on the metal substrate. Therefore, there is no conventional problem of substrate breakage in the backside polishing and thus the semiconductor layer can be made thin, so that unnecessary parasitic resistance can be reduced to enable an element to be driven at high speed. By reducing the thickness of the semiconductor layer to 20 μm or less, which has conventionally been about 200 μm, the series resistance of the vertical-type semiconductor element can be reduced.

FIG. 2 is a diagram in which the cutoff frequency of a bipolar transistor is plotted against the thickness of a substrate, and shows the dependence in the case where the conductivity type, impurity concentration, and thickness are set to n-type, $1 \times 10^{20}$ cm$^{-3}$, and 0.7 μm, p-type, $5 \times 10^{18}$ cm$^{-3}$, and 0.02 μm, and n-type, $2 \times 10^{17}$ cm$^{-3}$, and 0.5 μm for layers of an emitter, a base, and a collector, respectively, and to n-type and $1 \times 10^{20}$ cm$^{-3}$ for the substrate being in contact with the collector layer. It is necessary that the substrate be as low in resistance as possible for reducing the series resistance of the element. The impurity concentration of the substrate is required to be about $1 \times 10^{20}$ cm$^{-3}$ or more where the resistivity of the substrate becomes about 1 mΩcm or less which is sufficiently low. Degradation of the cutoff frequency starts from a point where the thickness of the substrate exceeds 20 μm and the cutoff frequency is reduced to about half of the maximum value at 200 μm being the conventional substrate thickness.

According to this invention, it is possible to drive the element at high speed by introducing the substrate with 20 μm or less. The same effect can be obtained using, instead of the foregoing n-type substrate, a p-type substrate, having an opposite conductivity type, with an impurity concentration of about $1 \times 10^{20}$ cm$^{-3}$ or more. Further, according to this invention, since the semiconductor silicon layer forming the semiconductor layer uses a crystal having a {110} plane orientation parallel to the substrate surface, it is possible to increase the diffusion constant of electrons or holes, thereby enabling current conduction or interruption at high speed. Further, by providing an element separating region penetrating semiconductor layers, a plurality of vertical-type semiconductor elements can be formed on a single substrate and, further, by forming wiring on both sides of the semiconductor layers, the semiconductor elements can be integrated to thereby reduce the size of a formed semiconductor device, so that it is possible to reduce parasitic capacitance and inductance possessed by the elements and the wiring. Accordingly, it is possible to relax the conventional problems of element operation delay and generation of surge voltage.

Further, according to a semiconductor substrate of this invention, since it is possible to form wiring layers on both sides of vertical-type semiconductor layers, an inverter or an ECL (emitter-coupled logic element) comprising vertical-type semiconductor elements, which can be conventionally obtained only by mounting individual elements on a wiring board, can be easily formed on a single substrate and, therefore, it is possible to realize various integrated circuits using vertical-type semiconductors.

In this invention, a {110} plane orientation implies a plane orientation crystallographically equivalent to a (110) plane and collectively represents, for example, a (011) plane, a (101) plane, or the like. Even if it is not completely consistent with the {110} plane orientation, the objects of this invention can be accomplished almost equivalently and, for example, use may be made of a plane orientation close to the {110} plane orientation, such as a (511) plane, a (331) plane, a (221)

plane, a (321) plane, a (531) plane, a (231) plane, a (351) plane, a (320) plane, a (230) plane, or the like.

Further, according to a semiconductor substrate of this invention, since it is configured such that a semiconductor layer is formed on a metal substrate, the series resistance of an element, which has been a problem with a conventional vertical-type semiconductor element, can be sufficiently reduced, thereby enabling current conduction or interruption at high speed. Further, using the metal substrate, the thermal conductivity of the substrate is improved. Therefore, the generated heat of the element can be removed to suppress thermal malfunction of the element due to the generated heat.

Further, according to a semiconductor substrate of this invention, a plurality of semiconductor layers having different conductivity types are formed in advance at a low temperature of about 600° C. or less as described above and the impurity profile can be precisely controlled, and therefore, it is possible to obtain a substantially stepwise steep impurity profile between the adjacent semiconductor layers and thus to minimize a depletion layer region formed between the semiconductor layers having different conductivity type polarities. Therefore, a high-performance element with a thin base layer or a short channel length can be manufactured by simple processes.

In this invention, the substantially stepwise impurity concentration profile represents a state where adjacent semiconductor layers are both formed at a low temperature of about 600° C. or less by an epitaxial growth method and there is obtained a steep concentration profile in which mutual impurity diffusion at the joining interface is small, and therefore, it is possible to obtain an impurity profile that cannot be obtained by a solid-phase diffusion method or an ion implantation method.

The diffusion constant of As, P, B, Sb, or the like, being impurities present in silicon, in the silicon at 600° C. is about $10^{-20}$ cm$^2$/s or less and the diffusion distance defined by the square root of the product of a time of existence in that atmosphere and a diffusion constant is 0.6 angstroms per hour. In this invention, the low temperature of 600° C. or less represents a region where diffusion of impurities does not occur in silicon.

BRIEF DESCRIPTION OF THE DRAWINGS

FIGS. 9(a) to 9(e) are exemplary diagrams showing, in order of process, a manufacturing method of an IGBT according to embodiment 3 of this invention.

FIG. 11 is a sectional view showing an example of constituting a semiconductor device according to embodiment 4 of this invention, which is formed by fabricating vertical-type semiconductor elements on a single substrate.

BEST MODE FOR CARRYING OUT THE INVENTION

Hereinbelow, embodiments of this invention will be described in detail with reference to the drawings.

Embodiment 1

Figure 3:
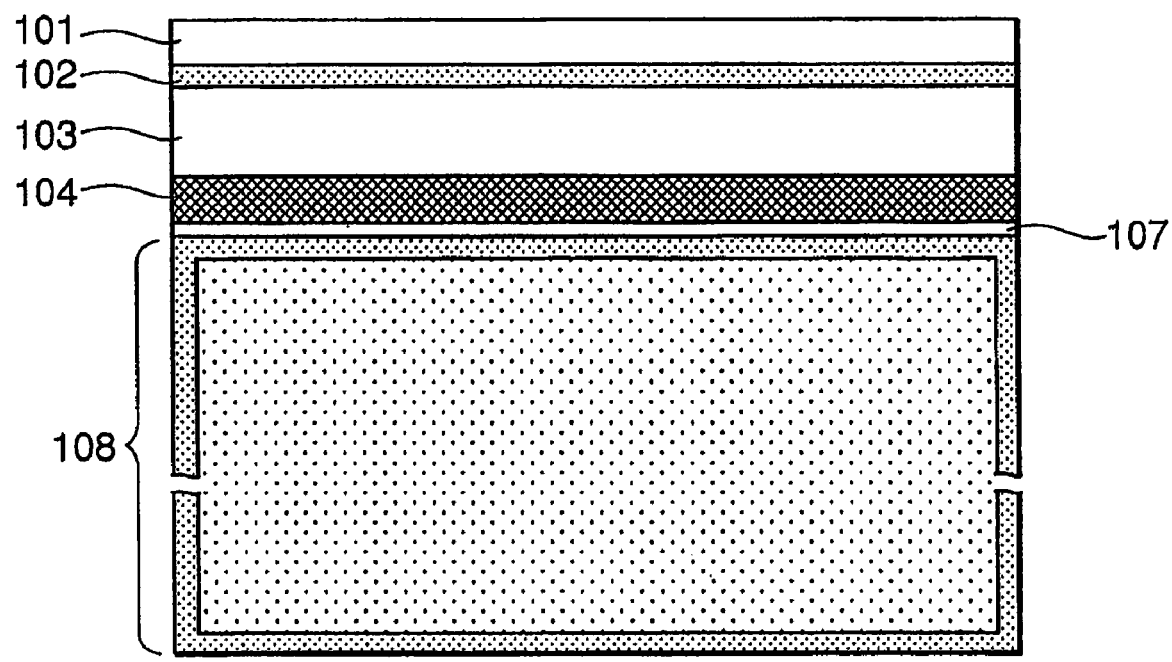
FIG. 3 is a sectional view showing the structure of a bipolar transistor semiconductor substrate according to embodiment 1 of this invention.

The structure and manufacturing method of a semiconductor substrate according to embodiment 1 of this invention will be described hereinbelow with reference to FIG. 3. A conductivity type referred to hereinbelow represents an n-type or a p-type of a silicon semiconductor and a change in impurity concentration is also included in a difference in conductivity type. FIG. 3 shows a sectional structure of a bipolar transistor substrate according to this embodiment. In FIG. 3, the bipolar transistor substrate comprises a Si layer 101 having a first conductivity type for forming an emitter layer, a Si layer 102 having a conductivity type opposite to the first conductivity type as a second conductivity type for forming a base layer, a Si layer 103 having a third conductivity type for forming a collector layer, a Si layer 104 having a fourth conductivity type for forming a collector electrode contact region, a metal substrate 108 connected to the Si layer having the fourth conductivity type to form a collector electrode, and a joining layer 107 joining together the foregoing semiconductor layers and the metal substrate.

The shown metal substrate 108 comprises a base formed of a first metal (e.g. Cu) and a connecting metal layer formed of a second metal (e.g. Ni) so as to cover the base.

In the bipolar transistor substrate of this invention, the Si layers having the plurality of conductivity types are formed on the metal substrate in advance. Since the Si layer 104 having the fourth conductivity type has an impurity concentration of about $1 \times 10^{20}$ cm$^{-3}$ or more and a thickness of 20 µm or less, the series resistance of a formed element can be reduced and therefore it is possible to easily form the element adapted to operate at high speed. Further, the Si layers are each a Si single crystal having a {110} plane orientation and thus the diffusion constants are larger as compared with the case where the conventional {100} plane orientation substrate is used, so that the operating speed can be improved.

Further, the Si layers are formed by low-temperature epitaxial growth at about 600° C. or less and the impurity profile is precisely controlled, and therefore, the high-performance element can be easily manufactured. The manufacturing method of such a bipolar transistor substrate will be described with reference to FIG. 4. FIG. 4 shows the manufacturing method of a substrate for an npn-type bipolar transistor as an example of a bipolar transistor according to this embodiment 1, which is formed in the following manner.

Figure 1:
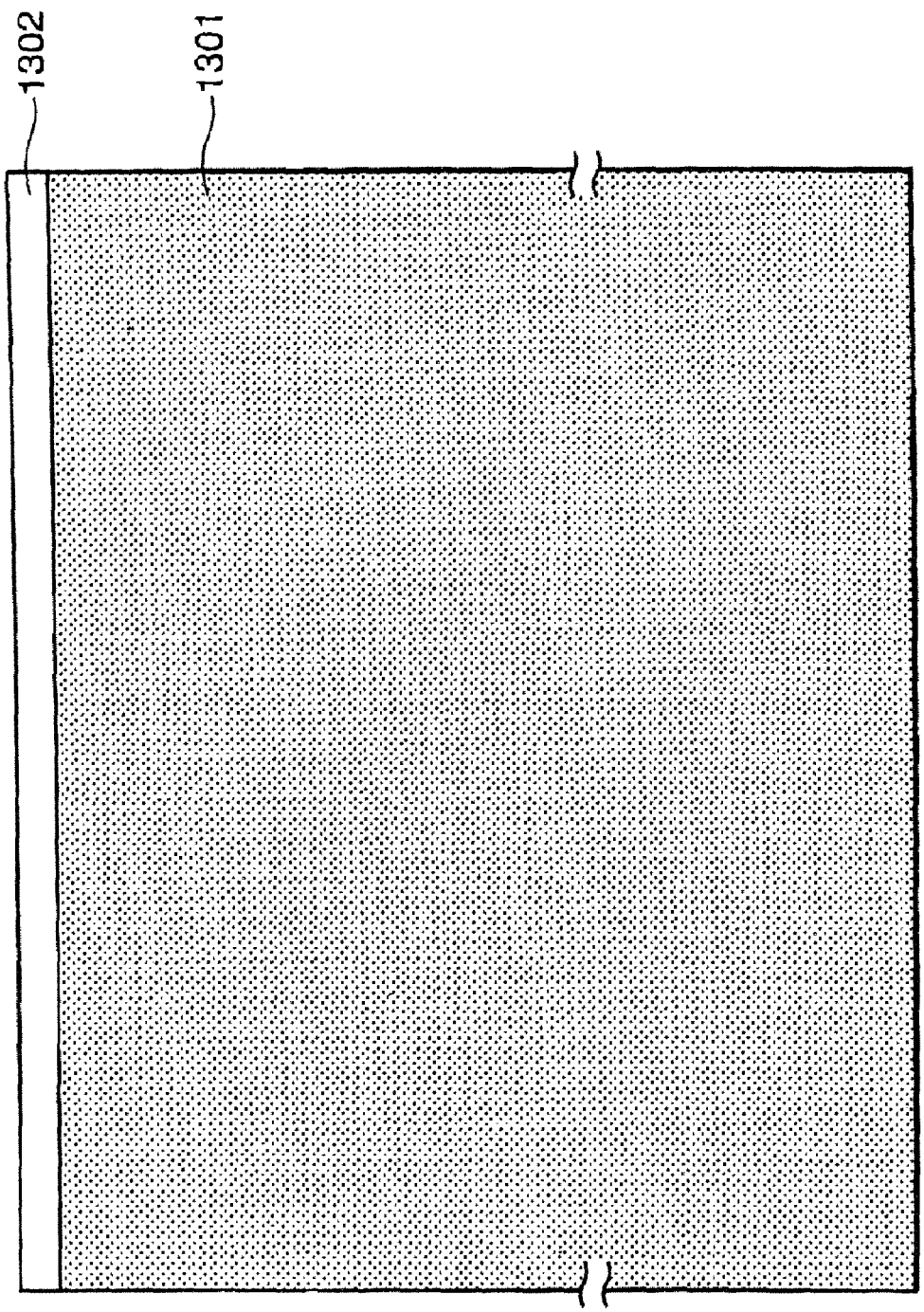
FIG. 1 is a sectional view showing the structure of a conventional silicon epitaxial substrate.
Figure 2:
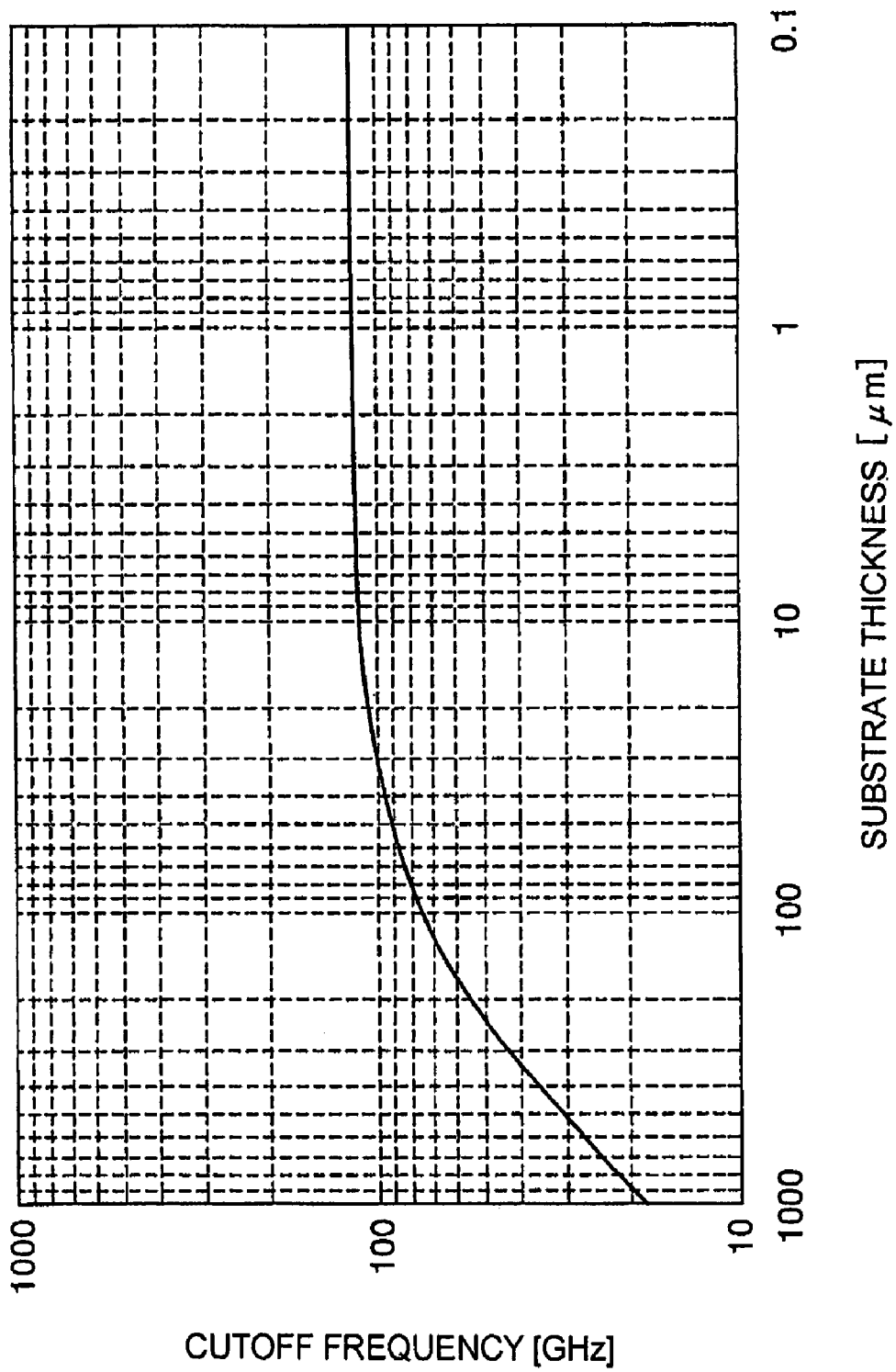
FIG. 2 is a characteristic diagram showing an effect of this invention, wherein the cutoff frequency indicative of an operating speed of an element is improved according to a reduction in series resistance of the element achieved by reducing the thickness of a semiconductor layer.
Figure 4A:
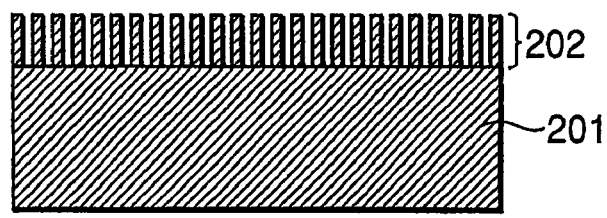
FIGS. 4(a) to 4(d) are exemplary diagrams showing, in order of process, a manufacturing method of the bipolar transistor semiconductor substrate according to embodiment 1 of this invention.
Figure 4B:
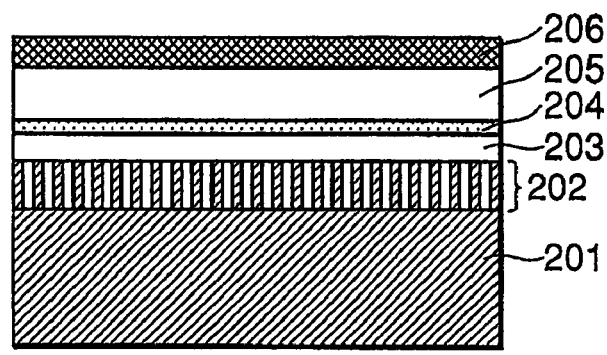

At first, on a silicon substrate 201 having a {110} plane, there is formed, using an anodization method, a porous silicon layer 202 which will serve as a base for epitaxial growth and will be used later for separating the silicon substrate and silicon layers from each other (FIG. 4(a)), and treatment is applied thereto in a hydrogen atmosphere at 1200° C., thereby sealing fine holes on the surface. Epitaxial growth of n-type silicon 203 which will serve as an emitter layer is performed at a temperature of 400° C. by a sputtering method. Then, using the same technique, a p-type base layer 204, an n-type collector layer 205, and an n-type high-concentration collector layer 206 are epitaxially grown in the order named (FIG. 4(b)). The thicknesses of the layers are set to 0.7 μm, 0.02 μm, 0.5 μm, and 0.1 μm, respectively, and the impurity concentrations are set to $1\times10^{20}$ cm$^{-3}$, $5\times10^{18}$ cm$^{-3}$, $2\times10^{17}$ cm$^{-3}$, and $1\times10^{20}$ cm$^{-3}$, respectively. These values can be changed according to the purpose of use and a withstand voltage of an element. However, it is preferable that the high-concentration collector layer 206 be sufficiently thin for the purpose of reducing the resistance, and 20 μm or less is preferable. This is because, as shown in FIG. 2, in the case of a high-concentration collector layer as thick as 20 μm or more, the electrical resistance of a collector electrode increases and thus a collector charging time defined by the product of the electrical resistance and the collector capacitance increases, thereby resulting in that the cutoff frequency indicative of an operating speed decreases.

Figure 4C:
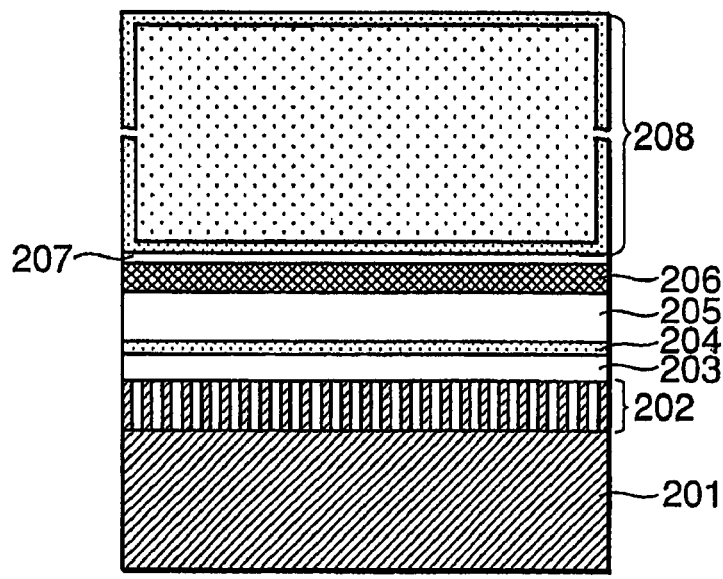

Then, as shown in FIG. 4(c), a later-described metal substrate 208 prepared in advance, which will serve as a support substrate of the element, and the foregoing silicon substrate are joined together. Ni is formed as a film at the bonding interface of the metal substrate with the silicon substrate and a silicide layer 207 is formed to join together the metal substrate and the semiconductor layer by silicidation reaction at a temperature of about 500° C. or less according to an RTA method or the like.

The foregoing metal substrate is formed in the following manner. At first, there is prepared a Cu substrate which will serve as a base of the metal substrate. The thickness of the Cu substrate is set to 200 μm which does not cause a problem in terms of mechanical strength. Subsequently, in order to prevent diffusion of Cu into the silicon layers, TaN is formed on the surface of the Cu substrate, for example, by a normal sputtering method. Ni is formed, by a plating method, on the entire surfaces of the Cu substrate formed with TaN by sputtering, wherein Ni can achieve passivation of the surfaces of the metal substrate and bonding of the substrate by silicidation with Si at a low temperature of about 400 to 500° C. or less. In this manner, the metal substrate is formed.

A material forming the base of the metal substrate is not limited to Cu, but may be any as long as it is a conductive metal or a metal compound, such as Au or Ag, having a resistivity of about 100 μΩcm or less which can cause a substrate resistance to be fully smaller than that of the foregoing high-concentration collector layer.

Further, the diffusion preventing layer is not limited to TaN, but may be any as long as it can prevent diffusion of the element forming the metal substrate into Si, such as TaSiN, TiN, or TiSiN.

Further, a material of the connecting metal layer acting as a bonding material by silicidation is not limited to Ni, but may be any as long as it is a material, such as Ti or Co, that produces silicidation reaction with Si at a low temperature of about 500° C. or less, thereby achieving bonding of the substrate.

Figure 4D:
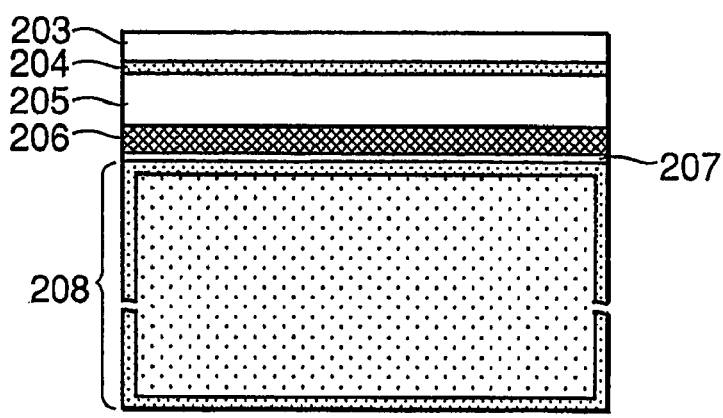
Figure 5C:
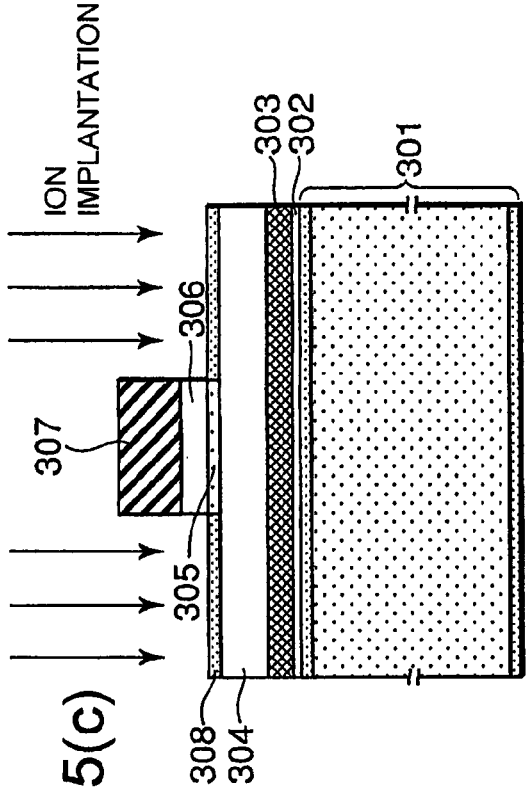
FIGS. 5(a) to 5(d) are sectional views showing, in order of process, a manufacturing method of a bipolar transistor according to this invention.
Figure 5D:
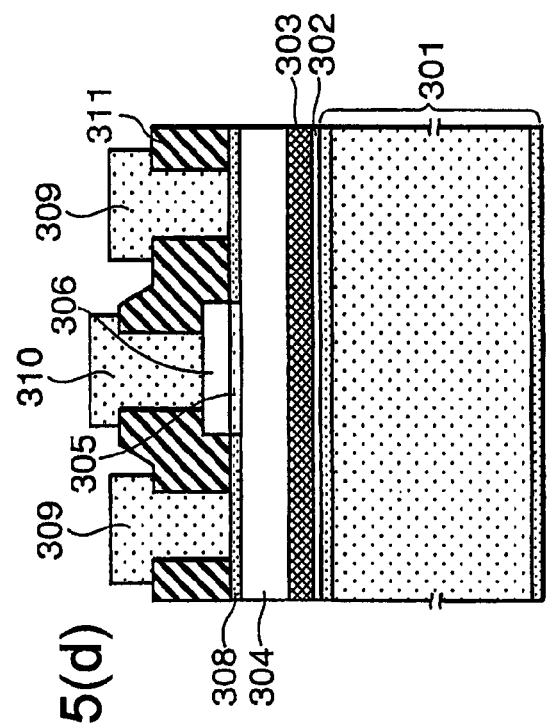
Figure 5A:
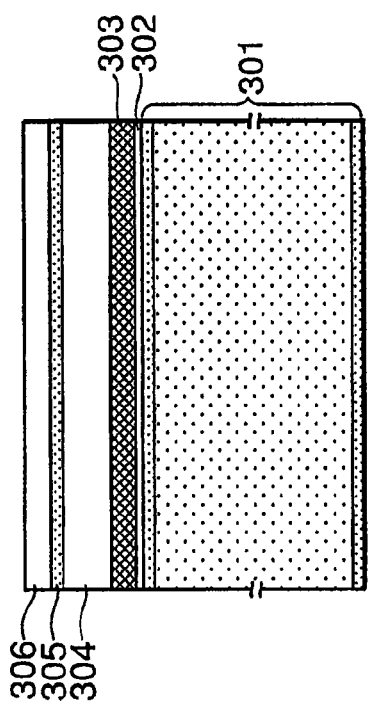
Figure 5B:
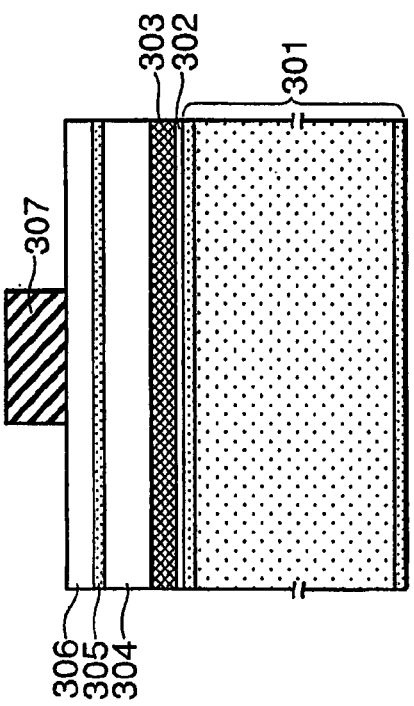

Then, cutting-off is carried out at the interface between the previously formed porous silicon 202 and the epitaxially grown silicon layer 203 (FIG. 4(d)).

In this manner, the semiconductor substrate according to this embodiment 1 is formed. Since the epitaxial growth is carried out at a low temperature of 600° C. or less, there is no problem of diffusion of impurities which has conventionally been the problem and, therefore, the thicknesses and impurity concentrations of the respective layers can be precisely controlled. Further, since the respective functional layers can be formed by the continuous sputtering film formation, it is not necessary to use the technique of impurity diffusion, ion implantation, or the like which has been conventionally required and, therefore, it is possible to form a high-quality substrate quite easily which will serve as a base for element formation.

Next, referring to FIG. 5, a description will be given of a manufacturing method of a bipolar transistor using the foregoing semiconductor substrate The foregoing substrate as embodied in FIG. 5 has n-type silicon 306 as an emitter, p-type base layer 305, n-type collector layer 304, n-type high-concentration collector layer 303, metal substrate 301 and silicide layer 302, and diffusion preventing layer as explained with respect to FIGS. 4(a) to 4(d). At first, on a semiconductor substrate completed by the foregoing processes (FIG. 5(a)), a photoresist 307 for masking an emitter region is coated and patterning of the resist is performed using a stepper or the like, thereby forming an opening in the resist on an emitter layer at a portion other than a portion corresponding to the emitter region (FIG. 5(b)).

Then, the emitter layer under the foregoing resist opening is removed by an RIE method or the like. Then, in the state where the remaining photoresist is not removed, ion implantation is applied to a base layer 305, thereby forming a base contact layer 308 for achieving electrical contact between a metal forming a base electrode and a silicon layer (FIG. 5(c)). Since the resist exists in the emitter region, the ion implantation is not applied thereto. Then, by the use of an ion implantation technique used in the semiconductor manufacture, ion implantation is carried out using $BF_2^+$ as an ion species to thereby cause an impurity concentration of the base layer except directly under the emitter to be $1\times10^{20}$ cm$^{-3}$, and recrystallization is performed by heat treatment in nitrogen at 550° C. for one hour. There arises no problem of diffusion of impurities at the temperature of 550° C. and thus the recrystallization can be achieved.

After the foregoing process, the photoresist 307 is stripped and, for example, SiO$_2$ 311 is formed as an interlayer insulating film on the entire surface of the substrate at a temperature of 400° C. by a CVD method. The interlayer insulating film is not limited to SiO$_2$, but may be any as long as it is an insulating material, such as SiON, SiOF, polyimide, or PTFE, used in the semiconductor manufacture.

Thereafter, a photoresist for contact hole formation is coated and subjected to patterning of base and emitter contact regions, thereby forming contact holes using an RIE method. Then, in order to prevent spiking of Al being an electrode material into Si, Al containing about 1% Si in atomic composition is formed as a film by a sputtering method and subjected to patterning, thereby forming a base electrode 309 and an emitter electrode 310 (FIG. 5(d)). With respect to the foregoing electrodes, Co, Ni, or the like may be formed as a film by a sputtering method in advance and use may be made of a silicide technique that carries out self-aligned silicidation using an RTA method, thereby achieving a reduction in contact resistance.

In the manner as described above, the bipolar transistor is fabricated using the substrate shown in this embodiment 1. Since the ion implantation process is performed once and all the processes are performed at the low temperatures of 600° C. or less, there is no problem of diffusion of impurities and, therefore, it is possible to easily manufacture the semiconductor substrate and the semiconductor element in which the impurity concentrations of the respective functional layers are accurately controlled. Further, since use is made of the low-temperature epitaxial growth method at about 600° C. or less, not the ion implantation method or the impurity diffusion method, the base layer can be easily formed thin and thus the high-performance semiconductor element can be easily fabricated at low cost.

Further, since the {110} plane with large diffusion constants is used as the crystal plane orientation, it is possible to fabricate the semiconductor element with a higher speed as compared with a conventional one. Since the high-concentration collector layer is as thin as 0.2 μm and thus is sufficiently reduced in resistance, there occurs no degradation of the element properties due to the substrate resistance, which has conventionally occurred. With respect to the cutoff frequency indicative of high-speed properties of an element, it is about 50 GHz in the case of the conventional {100} plane silicon substrate device while 116 GHz is obtained in this embodiment.

Embodiment 2

Figure 6:
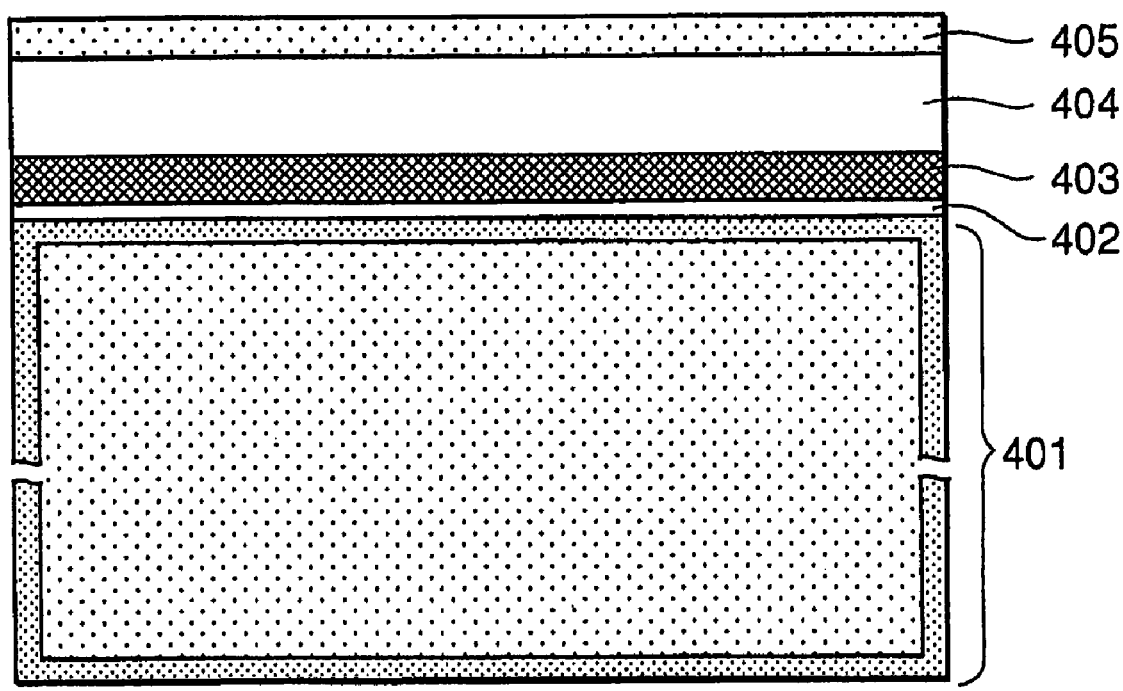
FIG. 6 is a sectional view showing the structure of a vertical-type MOSFET semiconductor substrate according to embodiment 2 of this invention.

The structure of a semiconductor substrate according to embodiment 2 of this invention will be described with reference to FIG. 6. FIG. 6 shows a vertical-type MOSFET substrate in this embodiment 2, wherein it comprises, on a metal substrate 401, a high-concentration drain layer 403 having a first conductivity type, a drain layer 404 having a second conductivity type which differs from the first conductivity type in impurity concentration, and a body layer 405 having a third conductivity type being a conductivity type opposite to the first conductivity type and used for forming a MOSFET channel. These layers are formed on a silicon substrate having a {110} plane by the same method as that shown in embodiment 1.

The conductivity types, impurity concentrations, and thicknesses of the respective layers are set to n-type, $1 \times 10^{20}$ cm$^{-3}$, and 0.2 μm for the high-concentration drain layer, n-type, $2 \times 10^{17}$ cm$^{-3}$, and 0.5 μm for the drain layer, and p-type, $5 \times 10^{18}$ cm$^{-3}$, and 0.2 μm for the body layer. In the vertical-type MOSFET substrate in embodiment 2 of this invention, the Si layers having the plurality of conductivity types are formed on the metal substrate in advance. Since the Si layer 403 having the first conductivity type has an impurity concentration of about $1 \times 10^{20}$ cm$^{-3}$ or more and a thickness of 20 μm or less, the series resistance of a formed element can be reduced and therefore it is possible to easily form the element adapted to operate at high speed.

Figure 7:
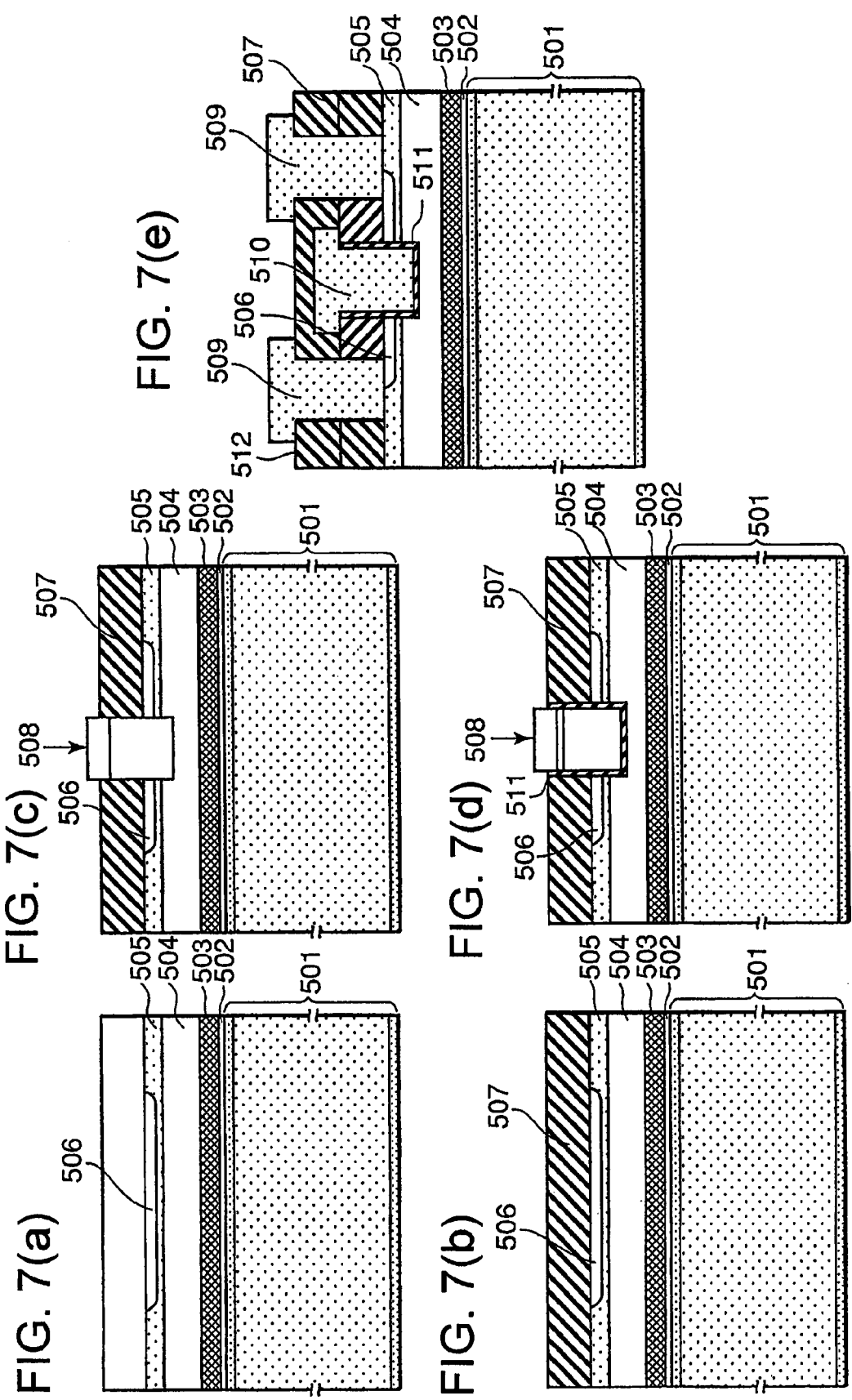
FIGS. 7(a) to 7(e) are sectional views showing, in order of process, a manufacturing method of a vertical-type MOSFET according to embodiment 2 of this invention.

Further, the Si layers are each a Si single crystal having a {110} plane orientation and thus the diffusion constants are larger as compared with the case where the conventional {100} plane orientation substrate is used, so that the operating speed can be improved. Further, the Si layers are formed by low-temperature epitaxial growth at about 600° C. or less and the impurity profile is precisely controlled, and therefore, the high-performance element can be easily manufactured. Referring to FIG. 7, a description will be given of a manufacturing method of a vertical-type MOSFET using the foregoing vertical-type MOSFET substrate.

FIG. 7 shows a manufacturing method of a vertical-type n-channel MOSFET using the vertical-type MOSFET substrate according to this embodiment 2, which will be described hereinbelow. Elements 501, 502, 503, 504, and 505 of FIGS. 7(a) to (7(e)) correspond, respectively, to elements 401, 402, 403, 404, and 405 of FIG. 6.

At first, in order to form a source region, As$^+$ being ions adapted to form a conductivity type opposite to that of a body region are implanted by an ion implantation method, thereby forming a source region 506 (FIG. 7(a)). Subsequently, in order to form an interlayer insulating film, SiO$_2$ 507 is deposited to 0.5 μm by a CVD method (FIG. 7(b)). By this, it is possible to reduce a gate electrode-source region overlapping capacitance.

Then, in order to form a gate electrode, a trench hole 508 is formed at a portion which will be the gate electrode (FIG. 7(c)). This is carried out in the following manner. A photoresist is coated on the entire surface of the substrate and patterning of the photoresist is carried out, thereby forming an opening in the resist at a trench forming portion. The opening is arranged in the source region. Then, a trench hole is formed by a generally used RIE method. The trench hole 508 is formed so that its bottom reaches a drain region 504 and, in this embodiment, is set to have a depth of 0.8 μm, a width of 0.3 μm, and a length of 20 μm. These values can be changed according to the purpose of use of an element.

Then, a gate oxide film is formed after removal of the photoresist. The formation of the gate oxide film is carried out such that plasma oxidation is performed at a temperature of 400° C. using a mixed gas of Kr and O$_2$, thereby forming an oxide film having a thickness of 5 nm on the inner walls of the trench hole. By this, the good-quality oxide film with a withstand voltage of 10 MV/cm or more can be uniformly formed on the inner walls of the trench hole 508 (FIG. 7(d)).

Subsequently to the above, a gate electrode 510 is formed. After depositing, for example, poly Si as a gate electrode material to 0.1 μm at 400° C. by a CVD method, Al containing about 1% Si in atomic composition is formed as a film by a sputtering method. A photoresist is coated on the entire surface of the substrate and patterning of a gate electrode portion is carried out, so that the gate electrode is completed.

Then, SiO$_2$ is deposited on the entire surface of the substrate at a temperature of 400° C. by a CVD method for forming an interlayer insulating film and a photoresist is coated and subjected to patterning of a source electrode portion 509 for forming a source electrode. In the patterning of the source electrode portion 509, an opening of the photoresist is formed so as to lie over both the source n$^+$ layer 506 and a body p layer 505. With this configuration, both the source potential and the body potential can be obtained at the source electrode.

Using an RIE method, SiO$_2$ at the opening of the photoresist is etched to thereby form a contact hole and Al containing about 1% Si in atomic composition is formed by a sputtering method, thereby forming the source electrode 509 (FIG. 7(e)).

Through the foregoing processes, the vertical-type MOSFET using the substrate according to embodiment 2 of this invention is completed. It is not necessary to perform ion implantation for body well formation which has been conventionally required and, thus, the impurity concentration can be accurately controlled. Further, since it is configured such that the functional layers necessary for formation of the element are formed in the substrate in advance, the manufacturing processes of the element can be simplified. Further, since the high-concentration drain layer is formed as thin as 0.2 μm and thus is sufficiently reduced in resistance, the series resistance of the element is small and, therefore, there is obtained the vertical-type MOSFET with no degradation in speed performance of the element due to the substrate resistance, which has conventionally occurred.

Further, for example, even in the case of a drain short-type element in which $p^+$ silicon and $n^+$ silicon are alternately arranged in a high-concentration drain region, it is possible to obtain an equivalent effect.

On the other hand, a vertical-type p-channel MOSFET with respective layers having conductivity types opposite to the foregoing ones can also be manufactured by the same processes. An example of this will be shown hereinbelow.

Referring again to FIG. 7, a description will be given of an embodiment in which this invention is applied to a trench-structure vertical-type p-channel power MOS transistor. Also in this case, use can be made of a vertical-type p-channel MOSFET substrate having the structure shown in FIG. 6. The structure shown in FIG. 7(a) is obtained by forming, on a silicon substrate (not shown) having a (110) plane, a high-concentration drain layer 503 having a first conductivity type, a drain layer 504 having a different impurity concentration but the same conductivity type as compared with the high-concentration drain layer, and a body layer 505 having a second conductivity type being a conductivity type opposite to the first conductivity type and used for forming a p-channel MOSFET channel. The conductivity types, impurity concentrations, and thicknesses of the respective layers are set to p-type, $1\times10^{20}$ cm$^{-3}$, and 0.2 μm for the high-concentration drain layer, p-type, $2\times10^{17}$ cm$^{-3}$, and 0.5 μm for the drain layer, and n-type, $5\times10^{18}$ cm$^{-3}$, and 0.2 μm for the body layer. In this embodiment, since the high-concentration drain layer 503 has an impurity concentration of about $1\times10^{20}$ cm$^{-3}$ or more and a thickness of 20 μm or less, the series resistance of a formed element can be reduced and therefore it is possible to easily form the element adapted to operate at high speed. Further, the layer 503 is a Si single crystal having a (110) plane orientation and thus the diffusion constants are larger as compared with the case where the conventional (100) plane orientation substrate is used, so that the operating speed can be improved. Further, the Si layers are formed by low-temperature epitaxial growth at about 600° C. or less and the impurity profile is precisely controlled, and therefore, the high-performance element can be easily manufactured.

Specifically, in the vertical-type trench-structure p-channel MOSFET according to this embodiment, the substrate shown in FIG. 6 is used and, as shown in FIG. 7(a), in order to form a source region, $BF_2^+$ is implanted by an ion implantation method so as to introduce boron adapted to form a conductivity type opposite to that of a body region 505, thereby forming a source region 506. The impurity concentration thereof is p-type $1\times10^{20}$ cm$^{-3}$. Subsequently, in order to form an interlayer insulating film, $SiO_2$ 507 is deposited to 0.5 μm by a CVD method (FIG. 7(b)). By this, it is possible to reduce a gate electrode-source region overlapping capacitance.

Then, as shown in FIG. 7(c), in order to form a gate electrode, a trench hole 508 is formed at a portion which will be the gate electrode. This is carried out in the following manner. A photoresist is coated on the entire surface of the substrate and patterning of the photoresist is carried out, thereby forming an opening in the resist at a trench forming portion. The opening is arranged in the source region. Then, a trench hole is formed by a generally used RIE method. The trench hole 508 is formed so that its bottom reaches a drain region 504 and, in this embodiment, is set to have a depth of 0.8 μm, a width of 0.3 μm, and a length of 20 μm. These values can be changed according to the purpose of use of an element. Since the surface of the silicon 505 has a (110) plane, the inner wall surfaces of the trench hole 508 angled at 90° thereto also have a (110) plane.

Then, as shown in FIG. 7(d), a gate oxide film 511 is formed after removal of the photoresist. The formation of the gate oxide film is carried out such that plasma oxidation is performed at a temperature of 400° C. using a mixed gas of Kr and $O_2$, thereby forming a silicon oxide film having a thickness of 20 nm on the inner walls of the trench hole. By this, the good-quality oxide film 511 with a withstand voltage of 4 to 5 MV/cm can be uniformly formed on the (110) plane inner walls of the trench hole 508. The gate-source withstand voltage of the p-channel MOS transistor having the gate oxide film 511 is 10V.

Then, as shown in FIG. 7(e), a gate electrode 510 is formed. After depositing, for example, poly Si as a gate electrode material to 0.1 μm at 400° C. by a CVD method, Al containing about 1% Si in atomic composition is formed as a film by a sputtering method. A photoresist is coated on the entire surface of the substrate and patterning of a gate electrode portion is carried out, so that the gate electrode 510 is completed.

Then, as shown again in FIG. 7(e), $SiO_2$ is deposited on the entire surface of the substrate at a temperature of 400° C. by a CVD method to form an interlayer insulating film 512 and then a source electrode 509 is formed. For the formation of the source electrode, a photoresist is first coated and then subjected to patterning of an opening for the source electrode portion 509. In the patterning of the source electrode opening, the opening of the photoresist is formed so as to lie over both the source $p^+$ layer 506 and the body n layer 505.

With this configuration, both the source potential and the body potential can be obtained at the source electrode 509. For opening formation, the $SiO_2$ films 507 and 512 at the opening of the photoresist are etched using an RIE method to thereby form a contact hole, and then Al containing about 1% Si in atomic composition is formed as a film by a sputtering method and patterning is applied thereto by etching, thereby forming the source electrode 509.

Through the foregoing processes, the trench-structure vertical-type p-channel power MOS field effect transistor according to this embodiment is completed. Since the high-concentration drain layer 503 is formed as thin as 0.2 μm and thus is sufficiently reduced in resistance, the series resistance of the element is small and, therefore, there is obtained the high-speed transistor.

Even in the case of a drain short-type element in which $n^+$ silicon and $p^+$ silicon are alternately arranged in a high-concentration drain region, it is possible to obtain an equivalent effect.

Embodiment 3

Figure 8:
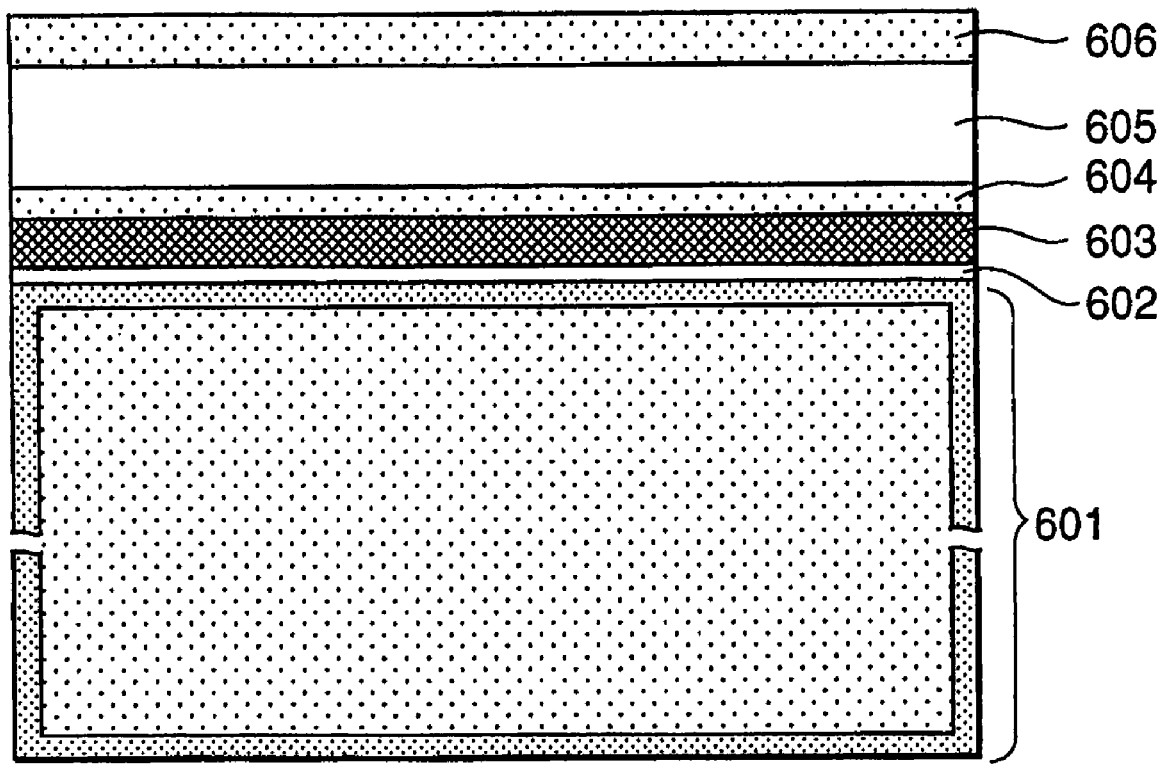
FIG. 8 is a sectional view showing the structure of an IGBT substrate according to embodiment 3 of this invention.

The structure of a semiconductor substrate according to embodiment 3 of this invention will be described with reference to FIG. 8. FIG. 8 shows a vertical-type IGBT substrate in this embodiment 3, wherein it comprises, on a metal substrate 601, an anode layer 603 having a first conductivity type, a buffer layer 604 having a second conductivity type opposite to the first conductivity type, a conductivity modulation layer 605, and a gate layer 606 having a third conductivity with the same polarity as that of the anode layer. These layers are formed on a silicon substrate having a {110} plane by the same method as that shown in embodiment 1. In this embodiment, the conductivity types, impurity concentrations, and thicknesses of the respective layers are set to p-type, $1 \times 10^{20}$ cm$^{-3}$, and 0.2 μm for the anode layer, n-type, $1 \times 10^{20}$ cm$^{-3}$, and 0.2 μm for the buffer layer, n-type, $2 \times 10^{17}$ cm$^{-3}$, and 0.2 μm for the conductivity modulation layer, and p-type, $5 \times 10^{18}$ cm$^{-3}$, and 0.2 μm for the gate layer, but can be changed according to a use and a withstand voltage of an element. However, it is preferable that the anode layer 603 be sufficiently thin for the purpose of reducing the resistance, and 20 μm or less is preferable. In the IGBT substrate in embodiment 3 of this invention, the Si layers having the plurality of conductivity types are formed on the metal substrate in advance. Since the Si layer 603 having the first conductivity type has an impurity concentration of about $1 \times 10^{20}$ cm$^{-3}$ or more and a thickness of 20 μm or less, the series resistance of a formed element can be reduced and therefore it is possible to easily form the element adapted to operate at high speed. Further, the Si layers are each a Si single crystal having a {110} plane orientation and thus the diffusion constants are larger as compared with the case where the conventional {100} plane orientation substrate is used, so that the operating speed can be improved. Further, the Si layers are formed by low-temperature epitaxial growth at about 600° C. or less and the impurity profile is precisely controlled, and therefore, the high-performance element can be easily manufactured. Referring to FIG. 9, a description will be given of a manufacturing method of an IGBT using the foregoing IGBT substrate.

FIG. 9 shows a method of forming, as an example, an n-channel gate-type IGBT element using the foregoing semiconductor substrate, which is formed in the following manner. Elements 701, 702, 703, 704, 705, and 706 of FIGS. 9(a) to 9(e) correspond, respectively, to elements 601, 602, 603, 604, 605, and 606 of FIG. 8.

At first, a cathode region 707 is formed by ion implantation of As$^+$ being ions adapted to form a conductivity type opposite to that of a gate layer (FIG. 9(a)). Subsequently, SiO$_2$ 708 is deposited to 0.5 μm as an interlayer insulating film by a CVD method (FIG. 9(b)). By this, it is possible to reduce a gate electrode-cathode region overlapping capacitance.

Then, a trench hole 709 is formed at a portion which will be a gate electrode. A photoresist is coated on the entire surface of the substrate and subjected to patterning, thereby forming an opening in the resist at a trench forming portion. Then, the trench hole 709 is formed by a generally used RIE method. The trench hole is formed so as to have a depth that reaches a conductivity modulation layer 705 and, in this embodiment, the depth is set to 0.8 μm, the width to 0.3 μm, and the length to 20 μm (FIG. 9(c)). These values can be changed according to the purpose of use of an element.

Then, a gate oxide film is formed after removal of the photoresist. The formation of the gate oxide film is carried out such that plasma oxidation is performed at a temperature of 400° C. using a plasma obtained by plasma-exciting a mixed gas of Kr and O$_2$, thereby forming an oxide film having a thickness of 5 nm. By this, the good-quality oxide film with a withstand voltage of 10 MV/cm or more can be uniformly formed on the inner walls of the trench hole 709 (FIG. 9(d)).

Subsequently to the above, a gate electrode 710 is formed. After depositing poly Si as a gate electrode material to about 0.1 μm at 400° C. by a CVD method, Al containing about 1% Si in atomic composition is formed as a film by a sputtering method. A photoresist is coated on the entire surface of the substrate and patterning of a gate electrode portion is carried out, so that the gate electrode 710 is completed.

Then, SiO$_2$ is deposited on the entire surface of the substrate at a temperature of 400° C. by a CVD method for forming an interlayer insulating film and a photoresist is coated and subjected to patterning of a source electrode portion 711 for forming a cathode electrode. In the patterning of the cathode electrode portion 711, an opening of the photoresist is formed so as to lie over both the source n$^+$ layer and the body p layer. With this configuration, both the source potential and the body potential can be obtained at the cathode electrode. Using an RIE method, SiO$_2$ at the opening of the photoresist is etched to thereby form a contact hole and Al containing about 1% Si in atomic composition is formed by a sputtering method, thereby forming the source electrode 711 (FIG. 9(e)).

Through the foregoing processes, the vertical-type IGBT using the substrate according to embodiment 3 of this invention is completed. It is not necessary to perform ion implantation for well formation which has been conventionally required and, thus, the impurity concentration can be accurately controlled. Further, since it is configured such that the functional layers necessary for the device are formed in the substrate in advance, the manufacturing processes of the element can be simplified. Further, since the anode layer is formed as thin as 0.2 μm and thus is sufficiently reduced in resistance, the series resistance of the element is small and thus the high-speed switching is realized.

Further, for example, even in the case of an anode short-type element in which p$^+$ silicon and n$^+$ silicon are alternately arranged in an anode region, it is possible to obtain an equivalent effect.

Further, an equivalent effect is also obtained in the case of a p-channel IGBT with respective layers having conductivity types opposite to the foregoing ones.

Embodiment 4

Figure 10C:
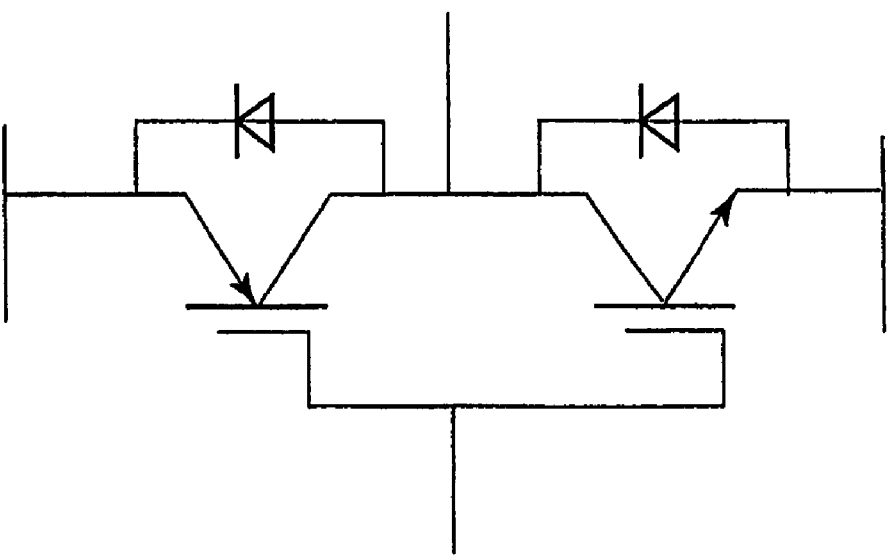
FIGS. 10(a) to 10(c) are circuit diagrams each showing an example of a semiconductor device according to embodiment 4 of this invention, which is formed by fabricating vertical-type semiconductor elements on a single substrate.
Figure 10B:
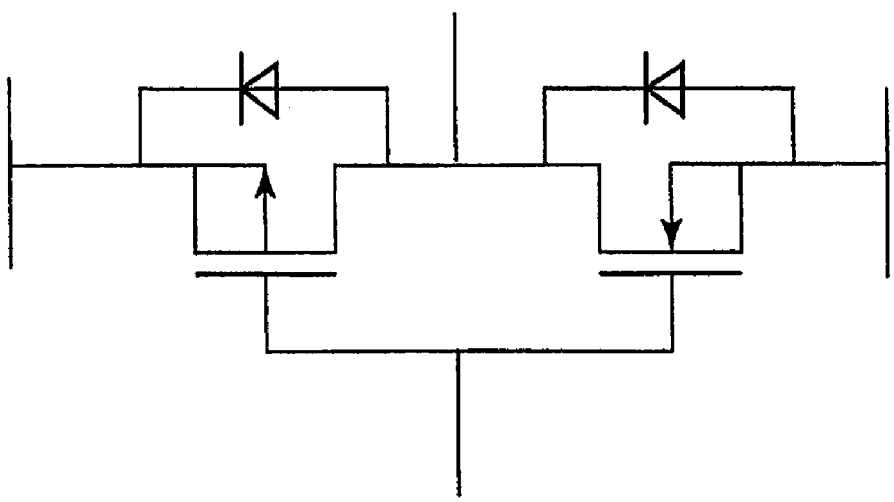
Figure 10A:
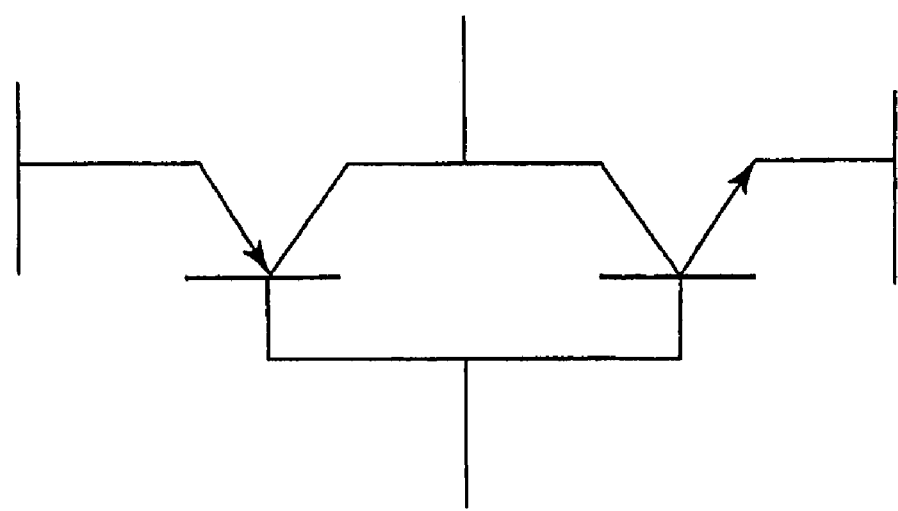

Semiconductor devices according to embodiment 4 of this invention will be described with reference to FIGS. 10 and 11. The semiconductor devices according to this embodiment 4 are each formed by complementary elements shown in FIG. 10. FIG. 10(a) shows a complementary inverter device using bipolar transistors. FIG. 10(b) shows a complementary inverter device using vertical-type MOSFETs. FIG. 10(c) shows a complementary inverter device using IGBTs. The semiconductor elements constituting such an inverter device each have a structure in which the conductivity type is reverse to that of the other and, further, each have a structure in which, because of being a vertical-type element, the element penetrates a substrate from the front surface to the back surface. According to the conventional technique, it is not possible to form a plurality of elements having different polarities on the same semiconductor substrate. Therefore, an inverter device has been manufactured by mounting elements formed on different semiconductor substrates, respectively, as individual elements and thus cannot be integrated and is large, so that wiring connecting between the respective constituent elements is prolonged and thus the inductance cannot be reduced, and therefore, there has arisen a problem of surge voltage generation due to the inductance component, or the like. Further, a pnp-type bipolar transistor formed in a {100} plane orientation as in the conventional manner has small diffusion constants of electrons and holes and thus is slow in operating speed, and therefore, it has been difficult to realize the complementary elements as shown in FIG. 10.

The semiconductor device according to this embodiment 4 is made operable as an integrated circuit by fabricating the semiconductor elements forming the semiconductor device on the single semiconductor substrate, thereby forming wiring between the semiconductor elements on the semiconductor substrate. Since the semiconductor layers forming the semiconductor element use silicon having a {110} plane orientation, the diffusion constants of electrons and holes are large and, therefore, even if a pnp-type bipolar transistor is used, since it has the performance equivalent to that of an npn-type bipolar transistor, the complementary structure is enabled. Therefore, since a plurality of elements with reversed polarities can mixedly exist on a single semiconductor substrate, a semiconductor device such as an inverter can be reduced in size and thus wiring between the elements can be shortened. Accordingly, parasitic capacitance and parasitic inductance possessed by the wiring can be reduced to thereby lessen those problems such as operation delay and generation of surge voltage, so that a semiconductor device operable at high speed can be provided at a low price.

Next, a forming method of the semiconductor device according to this embodiment 4 will be described with reference to FIG. 11. FIG. 11 shows a complementary inverter device formed by the use of npn-type and pnp-type bipolar transistors, among the semiconductor devices according to this embodiment 4. Symbols in the figure correspond to those in FIGS. 12 and 13. An npn-type bipolar transistor 1021 and a pnp-type bipolar transistor 1022 are formed on a metal substrate 1015 and are separated from each other by an element separating region 1023. Collector electrodes of both are electrically connected together by the metal substrate, thereby realizing the circuit structure shown in FIG. 10(a). Since it is possible to form the structure in which a plurality of elements with difference polarities mixedly exist on a single substrate, integration of the vertical-type semiconductor elements can be realized by the semiconductor substrate according to this embodiment, while, conventionally, it can only be realized by mounting individual elements. Since the collector electrodes are not connected by external wiring as opposed to the conventional technique, parasitic capacitance and parasitic inductance caused by the wiring can be reduced to thereby solve the conventional problems such as operation delay and generation of surge voltage, so that it is possible to provide a semiconductor device adapted to operate at high speed.

Referring to FIGS. 12 and 13, a description will be given of a manufacturing method of such a semiconductor device in which a plurality of vertical-type semiconductor elements with different polarities are formed on a single substrate. FIGS. 12 and 13 use, as an example, a complementary inverter employing bipolar transistors and explain a manufacturing method thereof.

Figure 12A:
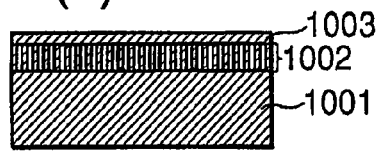
FIGS. 12(a) to 12(j) are exemplary diagrams showing, in order of process, a manufacturing method (first half) of a semiconductor device according to embodiment 4 of this invention, which is formed by fabricating vertical-type semiconductor elements on a single substrate.

At first, as shown in FIG. 12(a), on the surface of a silicon substrate 1001 having a {110} plane orientation, there is formed, using an anodization method, a porous silicon layer 1002 which will serve as a base for epitaxial growth of silicon and will be used for separating the base after bonding to a metal substrate. Treatment is applied thereto in a hydrogen atmosphere at 1200° C., thereby sealing fine holes on the surface. Then, as Si having a conductivity type opposite to a first conductivity type of a first element to be formed later, for example, n-type Si is epitaxially grown to about 0.1 μm on the porous silicon surface, thereby obtaining a buffer layer 1003 adapted for semiconductor layer formation.

Figure 12B:
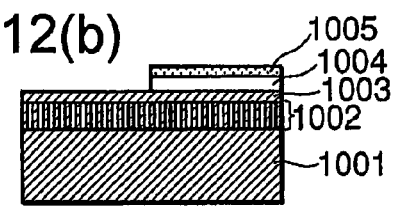
Figure 12C:
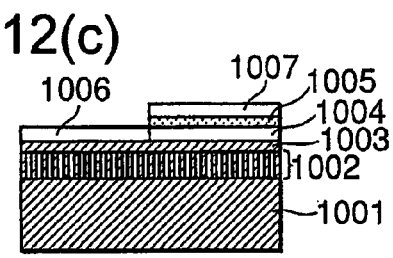

Then, as shown in FIG. 12(b), for example, p$^+$Si is formed, for example, by a sputtering method as a silicon layer 1004 having the first conductivity type for forming an emitter electrode of the first element. In this embodiment, it is formed to a thickness of 0.7 μm. Then, on the surface of the p$^+$Si 1004, SiO$_2$ 1005 is formed as a protective layer, for example, at a temperature of 400° C. by a CVD method. Then, the SiO$_2$ and the p$^+$Si are subjected to patterning by a photolithography method, thereby etching the p$^+$Si layer until the buffer layer 1003 appears. Then, a photoresist is removed and the p$^+$Si layer remains only in a region where the first element will be present (FIG. 12(b)). In this event, the SiO$_2$ layer 1005 is not removed.

Then, a silicon layer having a second conductivity type opposite to the first conductivity type of a second element is deposited on the surface having been subjected to the etching. For example, using a sputtering method, n$^+$Si is formed to a thickness equal to that of the p$^+$Si as an example of the first conductivity type of the first element. The formed n$^+$Si grows as an epitaxial film 1006, which will serve as an emitter electrode of the second element, on the buffer film 1003 and as amorphous silicon or polysilicon 1007 on the oxide film on the p$^+$Si (FIG. 12(c)).

Figure 12D:
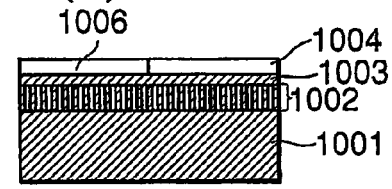
Figure 12E:
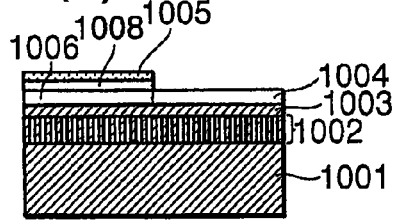
Figure 12F:
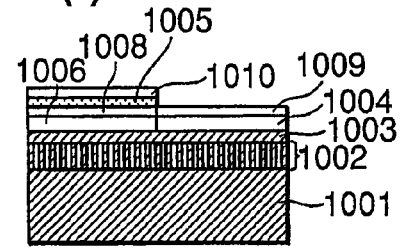

Then, the unnecessary n$^+$Si 1007 grown on the oxide film is removed. For the removal, use is made, for example, of a mixed solution of iodic acid, hydrofluoric acid, and acetic acid which generates only a small amount of heat. The non-single crystal n$^+$Si 1007 grown on the oxide film has a higher etching rate as compared with the epitaxially-grown single-crystal n$^+$Si 1006 and thus the sufficient selectivity is ensured, and therefore, only the non-single crystal n$^+$Si 1007 can be removed without changing the thickness of the single crystal n$^+$Si 1006. Then, using a buffered hydrofluoric acid solution to remove the oxide film formed on the p$^+$Si surface, the structure shown in FIG. 12(d) is completed.

Subsequently, as a layer 1008 having a third conductivity type which will serve as a base electrode of the second element, a layer having a conductivity type opposite to the second conductivity type of the second element is formed, for example, by a sputtering method. In this embodiment, p-type Si is formed to a thickness of 0.02 μm. Subsequently, on the surface deposited with the p-type Si layer 1008, SiO$_2$ 1005 is formed, for example, at a temperature of 400° C. by a CVD method. Patterning is carried out by a photolithography method and, then, for example, using an RIE method, the unnecessary oxide film and p-type Si of the SiO$_2$ 1005 and the p-type Si layer 1008 are removed at a portion other than a portion where the second element will be formed (FIG. 12(e)).

Then, as a layer having a fourth conductivity type for forming a base electrode of the first element, a layer having a conductivity type opposite to the first conductivity type of the first element is formed, for example, by a sputtering method. In this embodiment, n-type Si is formed to a thickness of 0.02 μm. The formed n-type Si grows as an epitaxial film 1009 on the p$^+$Si film 1004 and as amorphous silicon or polysilicon 1010 on the oxide film 1005 on the p-type Si layer 1008 (FIG. 12(f)).

Figure 12G:
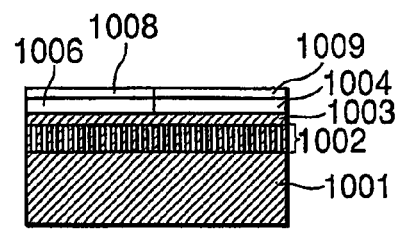

Subsequently, the unnecessary p-type Si grown on the oxide film is removed. For the removal, use is made of a mixed solution of iodic acid, hydrofluoric acid, and acetic acid which generates only a small amount of heat. The non-single crystal p-type Si 1010 grown on the oxide film has a higher etching rate as compared with the epitaxially-grown single-crystal p-type Si layer 1009 and thus the sufficient selectivity is ensured, and therefore, only the non-single crystal p-type Si layer 1010 can be removed without changing the thickness of the single crystal p-type Si layer 1009. Then, using a buffered hydrofluoric acid solution to remove the SiO$_2$ 1005 formed on the surface of the n-type Si layer 1008, the structure in which the mutually adjacent conductivity types of the semiconductor layers are reversed is completed as shown in FIG. 12(g).

Figure 12H:
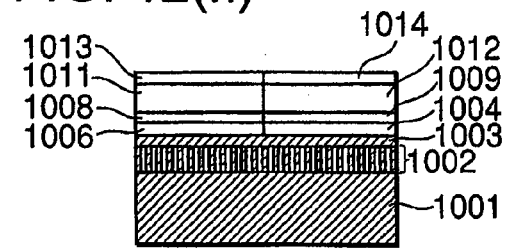

By repeatedly using the foregoing method, collector layers and high-concentration collector layers being the remainder of semiconductor layers are formed, thereby obtaining the structure of FIG. 12(h). The thicknesses of the layers are set to 0.5 μm for the collector layers of the first and second elements, respectively, and 0.2 μm for the high-concentration collector layers, respectively.

Figure 12I:
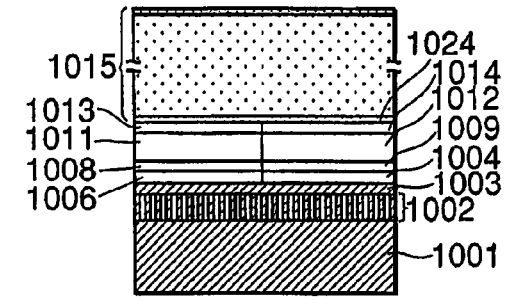
Figure 12J:
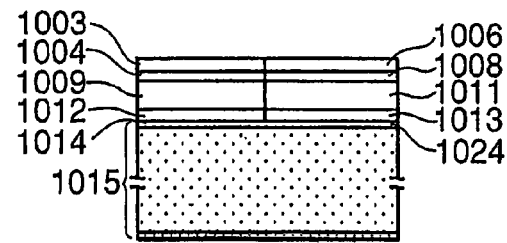

Then, as shown in FIG. 12(i), the foregoing silicon substrate and a metal substrate 1015 are bonded together. The metal substrate is configured such that, for example, a TaN layer is formed on the surface of a Cu substrate by a sputtering method for preventing diffusion and then a Ni layer is formed on the entire surfaces of the substrate by a plating method. Bonding together the silicon substrate and the metal substrate and carrying out treatment at a temperature of 500° C. by an RTA method or the like, Ni and Si cause silicidation reaction to form a silicide layer 1024, thereby achieving strong joining.

A material forming the base of the metal substrate is not limited to Cu, but may be any as long as it is a conductive metal or a metal compound, such as Au or Ag, having a resistivity of about 100 μΩcm or less which can cause a substrate resistance to be fully smaller than that of the foregoing high-concentration collector layer.

Further, the diffusion preventing layer is not limited to TaN, but may be any as long as it can prevent diffusion of the element forming the metal substrate into Si, such as TaSiN, TiN, or TiSiN.

Further, a bonding material for silicidation is not limited to Ni, but may be any as long as it is a material, such as Ti or Co, that produces silicidation reaction with Si at a low temperature of about 400 to 500° C. or less, thereby achieving bonding of the substrate.

Subsequently, the foregoing bonded substrate is cut off at the interface between the porous silicon portion 1002 and the buffer layer 1003 and the buffer layer is removed by etching according to an RIE method, thereby obtaining the structure shown in FIG. 120(j).

Figure 13A:
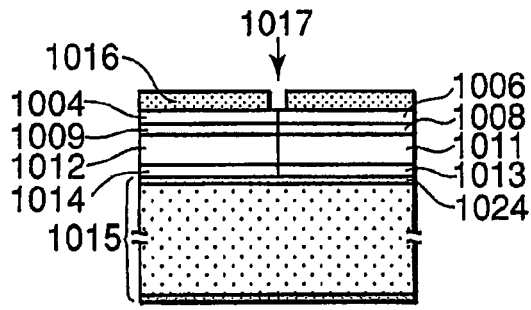
FIGS. 13(a) to 13(f) are exemplary diagrams showing, in order of process, a manufacturing method (latter half) of the semiconductor device according to embodiment 4 of this invention, which is formed by fabricating the vertical-type semiconductor elements on the single substrate.
Figure 13B:
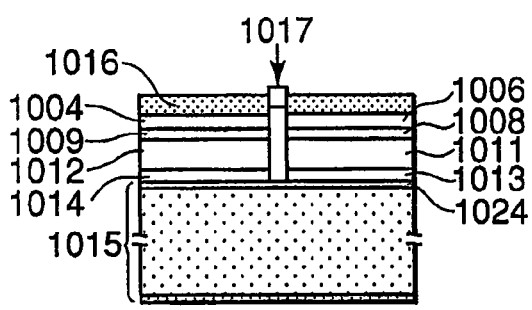
Figure 13C:
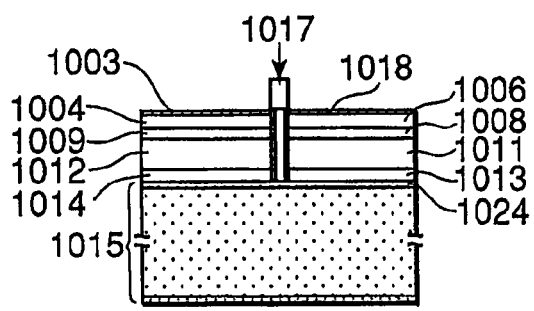
Figure 13D:
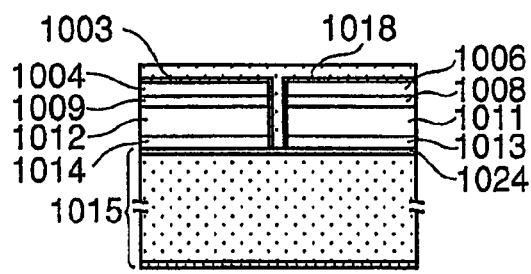
Figure 13E:
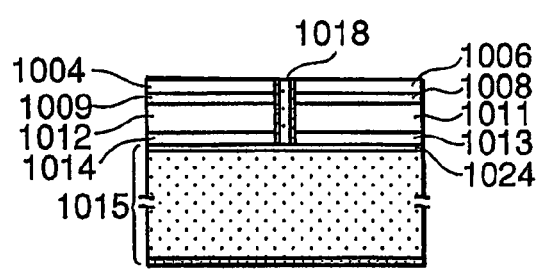

Then, for carrying out element separation between the first element and the second element, a photoresist is coated on the surface of the foregoing substrate on the side opposite to the metal substrate and an opening 1017 is formed in the photoresist at the boundary between the first element and the second element (FIG. 13(a)). Then, using an RIE method, a trench hole is formed at the foregoing opening portion. The trench hole extends from the front surface of the semiconductor layers so that its bottom reaches the back surface thereof and thus reaches the surface of the silicide layer serving to achieve the bonding to the metal substrate, thereby forming the structure shown in FIG. 13(b). The photoresist is removed. Then, in order to make excellent the interface properties of the separating region and the semiconductor layers, $SiO_2$ is formed to about 10 nm on the inner walls of the trench hole by a plasma oxidation method using Kr and $O_2$ (FIG. 13(c)). This oxide film is sufficient as long as it is insulative and, for example, use may be made of a $Si_3N_4$ film formed using a $NH_3$ plasma, or the like. Thereafter, using a CVD method, the inside of the trench hole is filled with $SiO_2$ 1018 at a temperature of about 400° C. (FIG. 13(d)). This $SiO_2$ formed by the CVD is sufficient as long as it is insulative and, for example, use may be made of $Si_3N_4$ formed using $NH_3$ and $SiH_4$, or the like. By removing the $SiO_2$ on the substrate surface, for example, by an RIE method, the structure shown in FIG. 13(e) is obtained. By this, the element separation between the first element and the second element is completed.

Figure 13F:
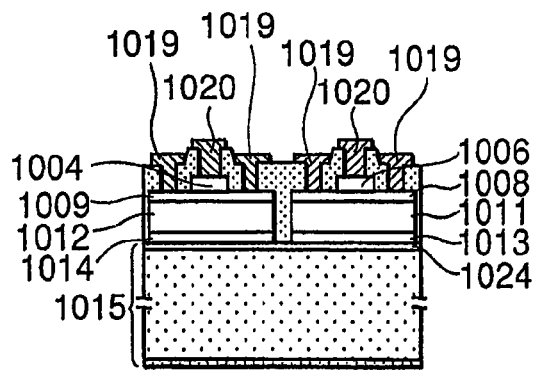
Figure 14A:
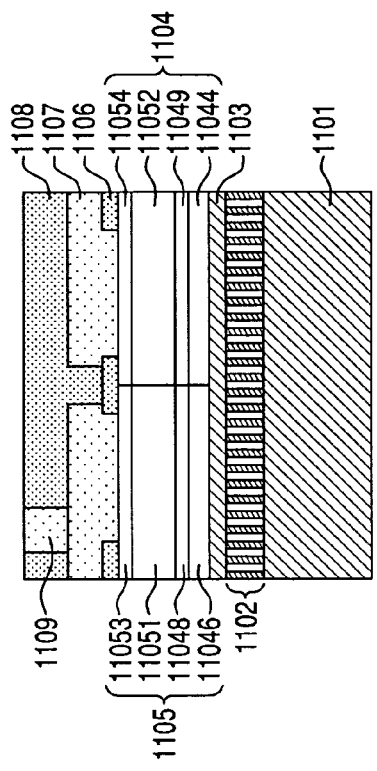
FIGS. 14(a) to 14(d) are exemplary diagrams showing, in order of process, a method of forming wiring structures on both sides of semiconductor layers, in a manufacturing method of a semiconductor device according to embodiment 5 of this invention which is formed by fabricating vertical-type semiconductor elements on a single substrate.
Figure 14C:
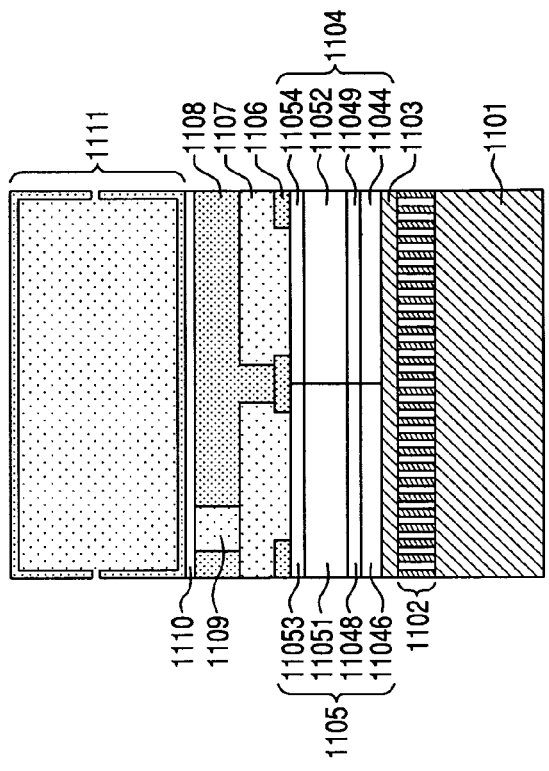
Figure 14B:
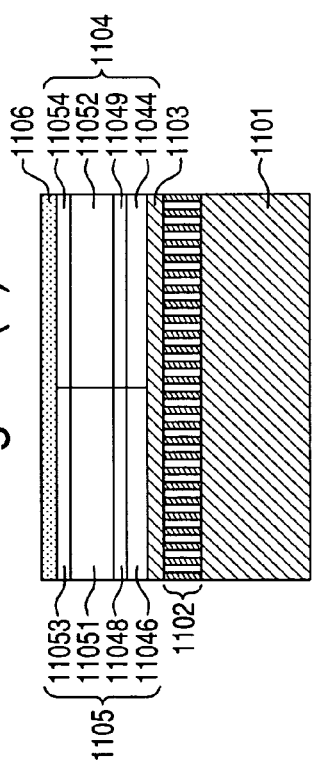
Figure 14D:
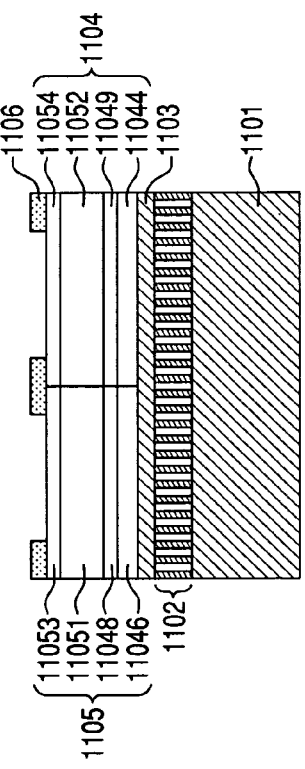

Then, base electrodes 1019 and emitter electrodes 1020 are formed by the same method as that described in embodiment 1, thereby completing an inverter device shown in FIG. 13(f). The collector electrodes of the first element and the second element are connected together by the metal substrate 1015 and thus no new wiring is necessary.

The thus obtained complementary inverter device formed by the bipolar transistors is made operable as an integrated circuit by fabricating the semiconductor elements forming the inverter device on the single semiconductor substrate, thereby forming wiring between the semiconductor elements on the semiconductor substrate. Since the semiconductor layers forming the semiconductor element use silicon having a {110} plane orientation, the diffusion constants of electrons and holes are large and, therefore, even if a pnp-type bipolar transistor is used, since it has the performance equivalent to that of an npn-type bipolar transistor, the complementary structure is achieved. Therefore, since a plurality of elements with reversed polarities mixedly exist on a single semiconductor substrate, it is possible to provide a small-size inverter device and thus wiring between the elements can be shortened. Accordingly, parasitic capacitance and parasitic inductance possessed by the wiring can be reduced to thereby lessen those problems such as operation delay and generation of surge voltage, so that a semiconductor device operable at high speed can be provided at a low price.

By applying the method shown in this embodiment, it is possible to form an integrated circuit having a common collector electrode, so that semiconductor devices such as inverters each formed by vertical-type semiconductor elements, which have each been formed by combining individual elements conventionally, can be efficiently integrated on a single substrate, thereby realizing an improvement in operating speed and a reduction in power consumption.

Since all the processes are performed at the low temperatures of 500° C. or less, there is no problem of impurity diffusion between the semiconductors having different conductivity types and, therefore, it is possible to easily control the impurity concentration distribution which is important for the element properties.

In this embodiment, the example of the bipolar transistors is shown. However, using the method shown in this embodiment, there is no essential difference even if vertical-type MOSFETs, IGBTs, or the like are used as vertical-type semiconductor elements and, further, it is also possible to form them in combination on the same substrate. Likewise, an integrated circuit structure is also possible in which lateral-type semiconductor elements and vertical-type semiconductor elements are integrated on a single substrate.

Further, forming a wiring layer on the collector side in advance before bonding a metal substrate and then bonding the metal substrate as a power supply substrate or the like, it can be used as an ECL (emitter-coupled logic element) and it is possible to realize any integrated circuit.

Embodiment 5

With respect to a forming method of an integrated circuit using vertical-type semiconductors formed with wiring layers on both sides of semiconductor layers according to this embodiment 5, a description will be given, referring to FIG. 14, of a method of forming a wiring layer on one side, closer to a metal substrate, of the semiconductor layers.

At first, using the method shown in embodiment 4, there is obtained the form immediately before bonding a metal substrate in the processes of forming a plurality of vertical-type semiconductor elements on a single substrate. Elements 1101, 1102, 1103, 11044, 11046, 11048, 11049, 11051, 11052, 11053, and 11054 of FIGS. 14(*a*) to 14(*d*) correspond, respectively, to elements 1001, 1002, 1003, 1004, 1006, 1008, 1009, 1011, 1012, 1013, and 10014 of FIG. 12(*h*). Then, for example, $SiO_2$ 1106 is formed as an insulting film, which will serve as an interlayer insulating film, on the substrate surface at a temperature of about 400° C. by a CVD method, thereby obtaining the structure in which the interlayer insulating film material exists on the surface of a semiconductor layer as shown in FIG. 14(*a*). In FIG. 14(*a*), semiconductor layers 1104 are shown as an example wherein a plurality of bipolar transistors are formed on a single substrate. However, like in the case of obtaining a vertical-type MOSFET or IGBT, or the like, even if the layer structure shown in the figure is not employed, the essence of this embodiment does not change.

Then, in order to perform draw-out wiring for collector electrodes, openings are formed in the interlayer insulating film 1106 at collector electrode portions of bipolar transistors using a normal photolithography method as shown in FIG. 14(*b*).

In this event, the patterning is carried out so as to leave the interlayer insulating film at the boundary between the first element and the second element. This is because, when element separation is performed later from the surface of the semiconductor substrate on the side opposite to the metal substrate according to the method shown in embodiment 4, the interlayer insulating film at the element boundary is used to function as an RIE etching stopping layer.

For example, Al containing about 1% Si in atomic composition, as a wiring metal, is formed as a film by a sputtering method and then a photoresist is subjected to patterning by a photolithography method, thereby forming collector electrodes 1107 using a technique such as RIE. Then, for example, $SiO_2$ is formed as an interlayer insulating film 1108 at a temperature of 400° C. By repeatedly using this, collector-side wiring is formed as shown in FIG. 14(*c*). The interlayer insulating film 1108 may be formed with a via 1109 for electrical connection between the collector electrode 1107 and a second or subsequent wiring layer or the metal substrate.

Then, for bonding the metal substrate serving as both a support substrate and a power supply substrate to the semiconductor substrate formed in the manner as described above, for example, n$^+$Si 1110 is deposited to about 10 nm on the entire surface of the semiconductor substrate on the collector side, for example, by a sputtering method. Thereafter, the metal substrate 1111 is joined to the n$^+$Si layer. The metal substrate may be, for example, the substrate with the Ni surfaces shown in embodiment 4, which forms a silicide layer 1112 by silicidation reaction between the n$^+$Si layer and the Ni layer at a temperature of about 500° C. or less, thereby obtaining strong joining (FIG. 14(*d*)).

In this manner, after forming the wiring on the collector side, the bonding to the metal substrate is carried out and, subsequently, emitter-side wiring is formed by the method shown in embodiment 4, thereby obtaining an integrated circuit using the vertical-type semiconductors with the wiring on both sides of the semiconductor layers.

Since the structure including a plurality of vertical-type semiconductors and having wiring on both sides of semiconductor layers can be realized on a single substrate, an ECL (emitter-coupled logic element) requiring wiring on the collector side, or the like can be easily formed on a single substrate.

According to this invention, by stacking in advance a semiconductor silicon layer, made of a crystal with a {110} plane orientation and having a controlled impurity concentration profile, on a low-resistance metal substrate at a low temperature of about 600° C. or less, it is possible to form the semiconductor layer on the metal substrate. Therefore, there is no conventional problem of substrate breakage in the backside polishing and thus the semiconductor layer can be made thin, so that unnecessary parasitic resistance can be reduced to enable an element to be driven at high speed. By reducing the thickness of the semiconductor layer to 20 µm or less, which has conventionally been about 200 µm, the series resistance of the vertical-type semiconductor element can be reduced. Further, according to this invention, since the semiconductor silicon layer forming the semiconductor layer is a crystal having a {110} plane orientation parallel to the substrate surface, it is possible to increase the diffusion constant of electrons or holes, thereby enabling current conduction or interruption at high speed. Further, by providing an element separating region serving to separate a plurality of semiconductor elements formed on a single substrate, the plurality of vertical-type semiconductor elements can be formed on the single substrate and, further, by forming wiring on both sides of semiconductor layers, the semiconductor elements can be integrated to thereby reduce the size of a formed semiconductor device, so that it is possible to reduce parasitic capacitance and inductance possessed by the elements and the wiring. Accordingly, it is possible to relax the conventional problems such as operation delay and generation of surge voltage. Further, according to a semiconductor substrate of this invention, since it is possible to form wiring layers on both sides of vertical-type semiconductor layers, an inverter or an ECL (emitter-coupled logic element) comprising vertical-type semiconductor elements, which can be conventionally obtained only by mounting individual elements on a wiring board, can be easily formed on a single substrate and, therefore, it is possible to realize various integrated circuits using vertical-type semiconductors.

Further, according to a semiconductor substrate of this invention, since it is configured such that a semiconductor layer is formed on a metal substrate, the series resistance of an element, which has been a problem with a conventional vertical-type semiconductor element, can be sufficiently reduced, thereby enabling current conduction or interruption at high speed. Further, using the metal substrate, the thermal conductivity of the substrate is improved. Therefore, the generated heat of the element can be removed to suppress thermal malfunction of the element due to the generated heat. Further, according to a semiconductor substrate of this invention, a plurality of semiconductor layers having different conductivity types or different impurity concentrations are formed in advance at a low temperature of about 600° C. or less and the impurity profile can be precisely controlled, and therefore, a high-performance element with a thin base layer or a short channel length can be manufactured by simple processes.

The invention claimed is:
1. A vertical-type semiconductor device comprising:
a metal substrate;
a semiconductor layer having at least a portion of an element; and
a silicide layer formed as a joining layer joining together the metal substrate and the semiconductor layer by silicidation, wherein said metal substrate comprises:

a metal base made of a first metal Cu;

a diffusion preventing layer directly formed on the metal base and adapted to prevent diffusion of the first metal Cu forming said metal base into said semiconductor layer, said diffusion preventing layer being made of a material selected from the group of consisting of TaN and TaSiN, and a connecting metal layer made of a second metal Ni for electrical connection between said metal base and said semiconductor layer and formed surrounding the metal base and the diffusion preventing layer, a part of the second metal Ni achieving bonding of the metal substrate by said silicide layer with the semiconductor layer.

2. The vertical-type semiconductor device according to claim 1, wherein said semiconductor layer is made of a silicon crystal having a plane orientation selected from the group consisting of a {110} plane orientation, plane orientations equivalent to said plane orientation; a {511} plane, a {331} plane, a {221} plane, a {321} plane, a {531} plane, a {231} plane, a {351} plane, a {320} plane, a {230} plane, and plane orientations equivalent thereto.

3. The vertical-type semiconductor device according to claim 1, wherein said semiconductor layer comprises a plurality of layers having different conductivity types.

* * * * *

UNITED STATES PATENT AND TRADEMARK OFFICE
CERTIFICATE OF CORRECTION

| | | |
|---|---|---|
| PATENT NO. | : 8,227,912 B2 | Page 1 of 1 |
| APPLICATION NO. | : 11/664279 | |
| DATED | : July 24, 2012 | |
| INVENTOR(S) | : Tadahiro Ohmi et al. | |

It is certified that error appears in the above-identified patent and that said Letters Patent is hereby corrected as shown below:

IN THE TITLE PAGE

Line (22) PCT Filed date "Oct. 10, 2004" should read as -- Oct. 01, 2004 --

Signed and Sealed this
Twentieth Day of November, 2012

David J. Kappos
*Director of the United States Patent and Trademark Office*

UNITED STATES PATENT AND TRADEMARK OFFICE
CERTIFICATE OF CORRECTION

PATENT NO. : 8,227,912 B2
APPLICATION NO. : 11/664279
DATED : July 24, 2012
INVENTOR(S) : Ohmi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 135 days.

Signed and Sealed this
Sixteenth Day of July, 2013

Teresa Stanek Rea
*Acting Director of the United States Patent and Trademark Office*